(12) United States Patent
Wu et al.

(10) Patent No.: US 11,094,817 B2
(45) Date of Patent: Aug. 17, 2021

(54) DRAIN EXTENDED NMOS TRANSISTOR

(71) Applicant: TEXAS INSTRUMENTS INCORPORATED, Dallas, TX (US)

(72) Inventors: Xiaoju Wu, Dallas, TX (US); Robert James Todd, Plano, TX (US); Henry Litzmann Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/750,020

(22) Filed: Jan. 23, 2020

(65) Prior Publication Data

US 2020/0161471 A1 May 21, 2020

Related U.S. Application Data

(63) Continuation of application No. 15/830,856, filed on Dec. 4, 2017, now Pat. No. 10,580,890.

(51) Int. Cl.
*H01L 29/66* (2006.01)
*H01L 29/78* (2006.01)
(Continued)

(52) U.S. Cl.
CPC ...... *H01L 29/7816* (2013.01); *H01L 21/2253* (2013.01); *H01L 21/26513* (2013.01); *H01L 21/28518* (2013.01); *H01L 21/324* (2013.01); *H01L 21/74* (2013.01); *H01L 21/76202* (2013.01); *H01L 21/76224* (2013.01); *H01L 29/0653* (2013.01); *H01L 29/1083* (2013.01); *H01L 29/1095* (2013.01);
(Continued)

(58) Field of Classification Search
CPC ............. H01L 29/7816; H01L 29/0653; H01L 29/1083; H01L 29/1095; H01L 29/408; H01L 29/66492; H01L 29/66681; H01L 29/7835; H01L 21/2253; H01L 21/26513; H01L 21/28518; H01L 21/324; H01L 21/74; H01L 21/76202–76221; H01L 21/76224–76237; H01L 21/823481; H01L 21/823878; H01L 2027/11833
USPC ....................................................... 257/336
See application file for complete search history.

(56) References Cited

U.S. PATENT DOCUMENTS 6,346,737 B1  2/2002  Higashitani et al.
6,605,845 B1  8/2003  Liang
(Continued)

FOREIGN PATENT DOCUMENTS

WO      2016132089      8/2016

OTHER PUBLICATIONS

Sohi, G. (2012) Introduction to Computer Engineering [PowerPoint slides]. The University of Wisconsin—Madison CS/ECE 252: http://pages.cs.wisc.edu/~sohi/cs252/Fall2012/lectures/lec03_digital_logic.pdf (Year: 2012).*

*Primary Examiner* — Calvin Y Choi
(74) *Attorney, Agent, or Firm* — Andrew R. Ralston; Charles A. Brill; Frank D. Cimino

(57) ABSTRACT

A semiconductor device includes a local oxidation of silicon (LOCOS) structure and a shallow trench isolation (STI) structure formed over a semiconductor substrate. A source region is located between the LOCOS structure and the STI structure. A gate structure is located between the source region and the LOCOS structure. A contact may be located over the STI structure electrically connect to the gate structure.

20 Claims, 20 Drawing Sheets

(51) Int. Cl.
*H01L 29/10* (2006.01)
*H01L 29/06* (2006.01)
*H01L 29/40* (2006.01)
*H01L 21/74* (2006.01)
*H01L 21/762* (2006.01)
*H01L 21/265* (2006.01)
*H01L 21/324* (2006.01)
*H01L 21/225* (2006.01)
*H01L 21/285* (2006.01)

(52) U.S. Cl.
CPC ...... *H01L 29/408* (2013.01); *H01L 29/66492* (2013.01); *H01L 29/66681* (2013.01); *H01L 29/7835* (2013.01)

(56) References Cited

U.S. PATENT DOCUMENTS

| | | |
|---|---|---|
| 6,617,652 B2 | 9/2003 | Noda |
| 6,768,167 B2 | 7/2004 | Nagoka et al. |
| 7,262,471 B2 | 8/2007 | Pan et al. |
| 7,321,141 B2 | 1/2008 | Sze |
| 7,374,999 B2 | 5/2008 | Ko |
| 7,427,795 B2 | 9/2008 | Pendharkar |
| 7,605,428 B2 | 10/2009 | Williams |
| 7,709,908 B2 | 5/2010 | Su et al. |
| 7,759,769 B2 | 7/2010 | Chiang et al. |
| 8,134,204 B2 | 3/2012 | Benaissa |
| 8,232,158 B2 | 7/2012 | Benaissa |
| 8,673,734 B2 * | 3/2014 | Park .................. H01L 21/76202 257/E21.545 |
| 8,823,095 B2 | 9/2014 | Lerner |
| 8,859,375 B2 | 10/2014 | Huang et al. |
| 9,159,795 B2 | 10/2015 | Yoo et al. |
| 9,184,097 B2 | 11/2015 | Chiang et al. |
| 9,601,614 B2 | 3/2017 | Min et al. |
| 2003/0089960 A1 | 5/2003 | Liu |
| 2008/0067591 A1 | 3/2008 | Tani |
| 2010/0270614 A1 * | 10/2010 | Croce ................ H01L 29/42368 257/337 |
| 2013/0105909 A1 | 5/2013 | Hu et al. |
| 2015/0069509 A1 | 3/2015 | Lee et al. |
| 2015/0162439 A1 | 6/2015 | Hoentschel et al. |
| 2015/0340496 A1 * | 11/2015 | Zhang ................ H01L 29/7816 257/337 |
| 2016/0043217 A1 | 2/2016 | Cai |
| 2016/0190248 A1 | 6/2016 | Rothleitner |
| 2016/0351699 A1 | 12/2016 | Boos et al. |

* cited by examiner

DRAIN EXTENDED NMOS TRANSISTOR

CROSS-REFERENCE TO RELATED APPLICATION(S)

The present application claims priority to U.S. patent application Ser. No. 15/830,856 filed on Dec. 4, 2017, issued as U.S. Pat. No. 10,580,890, the entirety of which is incorporated herein by reference.

FIELD

This disclosure relates to the field of semiconductor devices. More particularly, this disclosure relates to n-channel metal oxide semiconductor (NMOS) transistors in semiconductor devices.

BACKGROUND

A semiconductor device may include an n-channel metal oxide semiconductor (NMOS) transistor having an extended drain. There are several possible configurations for the NMOS transistor. The NMOS transistor may be used to modulate current through a load in a high-side configuration, with the NMOS transistor being connected between the load and a positive power supply node. In this configuration, the NMOS transistor may be isolated from the substrate, with the source of the NMOS transistor connected to the load, so the potential of the source varies with respect to a ground reference. Alternatively, the NMOS transistor may be used to modulate current through a load in a low-side configuration, with the NMOS transistor being connected between the load and a ground node. In this configuration, it may be desirable to modulate the potential of the body of the NMOS transistor to reduce on-state resistance and increase off-state resistance. The semiconductor device may also include logic circuits operating at 5 volts or less, while the positive power supply node connected to the NMOS transistor may have a potential significantly higher than the logic circuits, for example, 20 volts to 40 volts, or more. Integrating such an NMOS transistor with the logic circuits while keeping fabrication cost and complexity under control has become more problematic as the dimensions and operating voltages of the logic circuits have become smaller with each new logic technology node.

SUMMARY

The present disclosure introduces a semiconductor device which includes an NMOS transistor having an extended drain. The NMOS transistor has a back gate connection with a source region disposed on opposite sides of the back gate connection. The source region and back gate connection are laterally isolated by a shallow trench isolation (STI) oxide layer which surrounds the back gate connection. The NMOS transistor has a gate having a closed loop configuration. The gate extends partway over a local oxidation of silicon (LOCOS) oxide layer; the LOCOS oxide layer surrounds, and is laterally separated from, the STI oxide layer. A lightly-doped drain layer is disposed on opposite sides of the NMOS transistor, extending under the LOCOS oxide layer to a body region of the NMOS transistor. The LOCOS oxide layer is thinner than the STI oxide layer, so that the portion of the gate over the LOCOS oxide layer provides a field plate functionality to reduce an electric field in the underlying drift layer. A method of forming the semiconductor device is also disclosed.

DETAILED DESCRIPTION

Figure 1A:
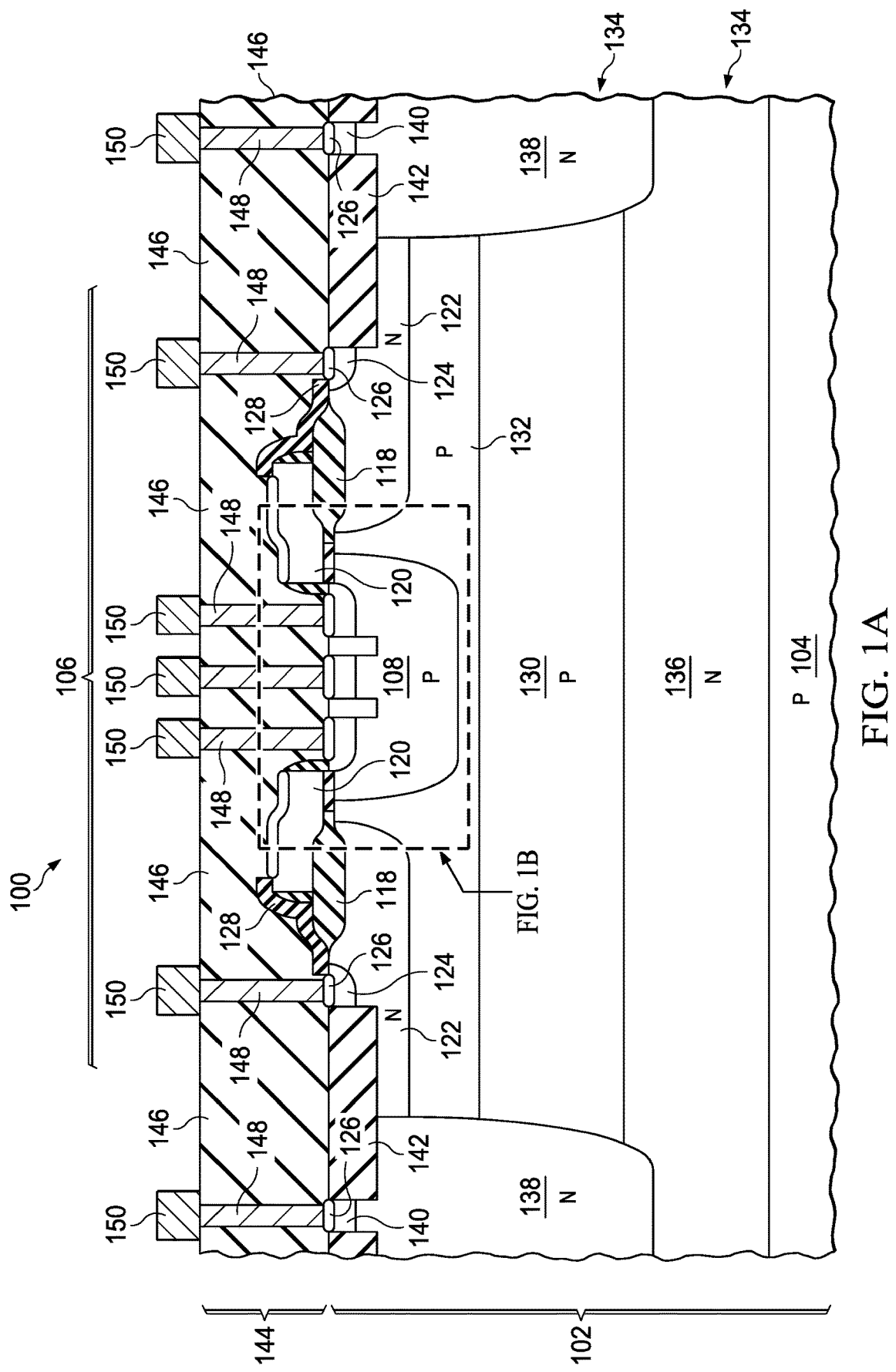
FIG. 1A and FIG. 1B are cross sections of an example semiconductor device which includes an NMOS transistor.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A semiconductor device includes an NMOS transistor, which may have a single finger configuration or a multiple finger configuration. Each finger has a back gate connection, also known as a body connection, in a linear configuration, and a source region disposed on opposite sides of the back gate connection. The source region and back gate connection are laterally isolated by an STI oxide layer which surrounds the back gate connection. Each finger of the NMOS transistor has a gate having a closed loop configuration, surrounding the source region and back gate connection. The gate extends from the source region, over a portion of a body region of the NMOS transistor, and partway over a LOCOS oxide layer. The LOCOS oxide layer surrounds the STI oxide layer, and is laterally separated from the STI oxide layer. Each finger has a lightly-doped drain layer which is disposed on opposite sides of the gate, across from the source region. The lightly-doped drain layer extends under the LOCOS oxide layer to the body region of the NMOS transistor. The lightly-doped drain layer provides a drain drift layer during operation of the semiconductor device. The LOCOS oxide layer is thinner than the STI oxide layer and has tapered edges, so that the portion of the gate over the LOCOS oxide layer may act as a field plate to reduce an electric field in the underlying drift layer. Drain contacts are located on the lightly-doped drain layer outside of the LOCOS oxide layer. A charge balance layer is disposed under the lightly-doped drain layer to further reduce the electric field in the underlying drift layer. Adjacent fingers of a multiple finger configuration may abut along edges of the lightly-doped drain layers and may share the drain contacts.

The NMOS transistor may optionally be surrounded by an isolation structure which extends under the NMOS transistor. In such a configuration, the NMOS transistor may be operated as a high-side NMOS transistor in which the drain is connected to a positive voltage supply and the source region is connected to a load, so that the body region is operated at a potential several volts above the substrate. The isolation structure reduces current leakage from the body region to the substrate. Alternatively, the NMOS transistor may be operated as an isolated NMOS transistor, in which source region and drain may be operated at variable potentials. The isolation structure reduces current leakage from the body region, and from the drain, to the substrate.

For the purposes of this disclosure, the term "instant top surface" of a semiconductor device is understood to refer to a top surface of the semiconductor device which exists at the particular step being disclosed. The instant top surface may change from step to step in the formation of the semiconductor device. For the purposes of this disclosure, the term "lateral" is understood to refer to a direction parallel to a plane of the instant top surface of the semiconductor device.

It is noted that terms such as top, bottom, over, above, under, and below may be used in this disclosure. These terms should not be construed as limiting the position or orientation of a structure or element, but should be used to provide spatial relationship between structures or elements.

Figure 1B:
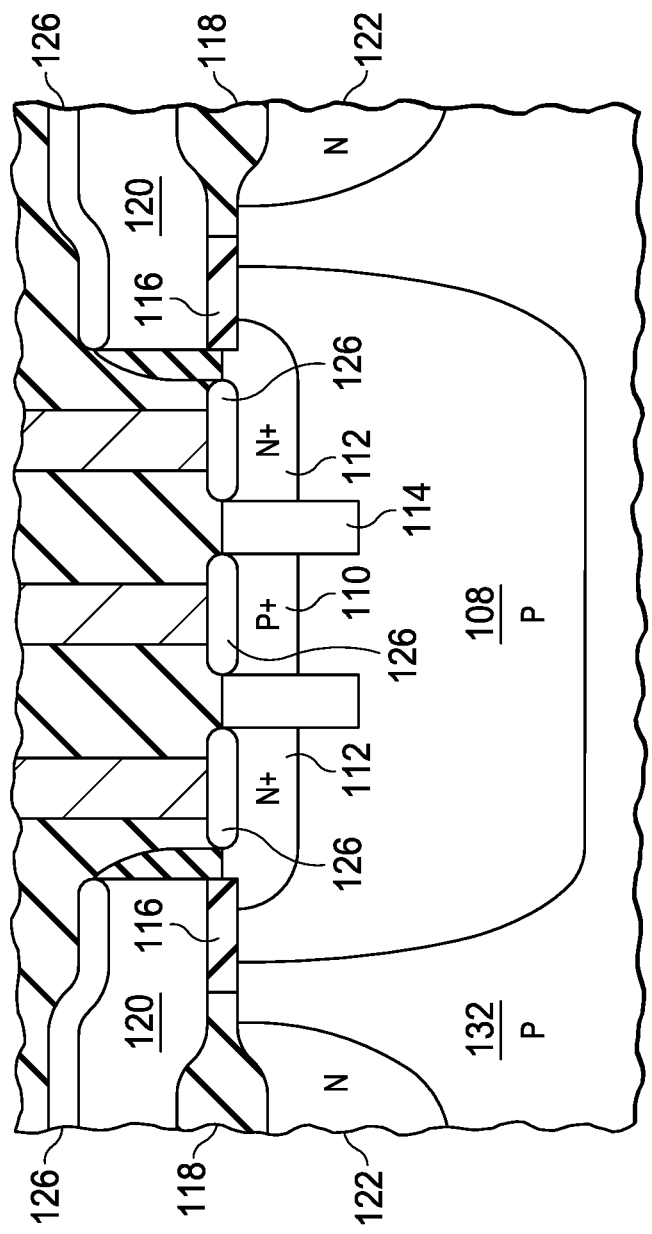

FIG. 1A and FIG. 1B are cross sections of an example semiconductor device which includes an NMOS transistor. The semiconductor device 100 has a substrate 102 with p-type semiconductor material 104. The substrate 102 may be a portion of a semiconductor wafer, such as a silicon wafer, for example. The p-type semiconductor material 104 may include primarily silicon, with boron dopant. Other semiconducting compositions for the p-type semiconductor material 104 are within the scope of the instant example.

The NMOS transistor 106 has a body region 108 of p-type semiconductor material in the substrate 102, and a body connection 110 on the body region 108. The body region 108 may have an average dopant density of $1 \times 10^{17}$ cm$^{-3}$ to $1 \times 10^{19}$ cm$^{-3}$, for example. The body connection 110 may include, for example, a p-type region in the substrate 102 having an average dopant density of $3 \times 10^{19}$ cm$^{-3}$ to $3 \times 10^{20}$ cm$^{-3}$, to provide a low resistance electrical connection to the body region 108.

The NMOS transistor 106 has a source region 112 disposed in the substrate 102 on opposite sides of the body connection 110. The source region 112 may include n-type semiconductor material having an average dopant density of $1 \times 10^{19}$ cm$^{-3}$ to $1 \times 10^{20}$ cm$^{-3}$, for example.

The source region 112 is laterally separated from the body connection 110 by an STI oxide layer 114. The STI oxide layer 114 laterally surrounds the body connection 110, so that the members of the STI oxide layer 114 shown in FIG. 1B are joined at locations out of the plane of FIG. 1B. The STI oxide layer 114 extends below the source region 112 and the body connection 110; for example, the STI oxide layer may extend 300 nanometers to 500 nanometers into the substrate 102. The STI oxide layer 114 may be characterized by being disposed in a trench in the substrate, the trench having substantially straight sides, the trench being wider at a top of the STI oxide layer 114 than at a bottom. The trench is filled with dielectric material such as silicon dioxide. The top of the STI oxide layer 114 may be substantially coplanar, for example, within 10 nanometers, with a top surface of the substrate 102.

The NMOS transistor 106 includes a gate dielectric layer 116 on the top surface of the substrate 102 adjacent to the source region 112. The gate dielectric layer 116 may include silicon dioxide formed by a thermal oxidation process, and may include nitrogen added by exposure to a nitrogen-containing plasma. The gate dielectric layer 116 may include high-k dielectric material such as tantalum oxide, hafnium oxide, or zirconium oxide. The gate dielectric layer 116 may be, for example, 2 nanometers to 10 nanometers thick. The gate dielectric layer 116 may have a composition and thickness that are substantially equal to other gate dielectric layers in other NMOS transistors, such as input/output transistors, of the semiconductor device 100, as a result of being formed concurrently.

A LOCOS oxide layer 118 is disposed on the substrate 102 adjacent to the gate dielectric layer 116, opposite from the source region 112. The LOCOS oxide layer 118 includes silicon dioxide formed by a thermal oxidation process, and may be characterized by having tapered edges. The LOCOS oxide layer 118 is 50 nanometers to 150 nanometers thick. In one version of the instant example, the LOCOS oxide layer 118 may have 40 percent to 45 percent of the silicon dioxide below the top surface of the substrate (for example the top surface under the adjacent gate dielectric layer 116. The LOCOS oxide layer 118 has a closed loop configuration, laterally surrounding the gate dielectric layer 116, the source region 112, the STI oxide layer 114, and the body connection 110.

The NMOS transistor 106 includes a gate 120 which extends from the source region 112, over the gate dielectric layer 116 and partway over the LOCOS oxide layer 118. The gate 120 has a closed loop configuration, so that the members of the gate 120 shown in FIG. 1A and FIG. 1B are joined at locations out of the planes of FIG. 1A and FIG. 1B. The gate 120 may include polycrystalline silicon, commonly referred to as polysilicon, and may have n-type dopants such as phosphorus, arsenic, or antimony to provide a desired work function. Other compositions for the gate 120 are within the scope of the instant example. Sidewall spacers may be disposed on lateral surfaces of the gate 120 as depicted in FIG. 1A and FIG. 1B. The sidewall spacers may include silicon dioxide and silicon nitride.

The NMOS transistor 106 includes a lightly-doped drain layer 122 in the substrate 102, extending under the LOCOS oxide layer 118 to a location under the gate 120 that is proximate to the body region 108. The lightly-doped drain layer 122 is disposed on opposite sides of the body region 108. The lightly-doped drain layer 122 is n-type, with phosphorus and possibly arsenic dopants, and may have an average dopant density of $1 \times 10^{16}$ cm$^{-3}$ to $3 \times 10^{17}$ cm$^{-3}$, for example. Drain contact regions 124 may be disposed in the substrate 102 on the lightly-doped drain layer 122. The drain contact regions 124 may include an n-type region in the substrate 102 having an average dopant density similar to the source region 112 as a result of being formed concurrently with the source region 112. The drain contact regions 124 may be recessed from the LOCOS oxide layer 118, which may advantageously improve reliability of the NMOS transistor 106 by reducing hot carrier trapping during operation of the semiconductor device 100.

Metal silicide 126 may be disposed on the body connection 110, the source region 112, the drain contact regions 124, and the gate 120. The metal silicide 126 on the drain contact regions 124 is recessed from the LOCOS oxide layer 118. A silicide block layer 128 may be disposed over an edge of the LOCOS oxide layer 118 adjacent to the drain contact regions 124 and extending partway onto the gate 120. The silicide block layer 128 prevents formation of the metal silicide 126 under silicide block layer 128, and thus may provide a desired lateral separation between the metal silicide 126 and the edge of the LOCOS oxide layer 118. The silicide block layer 128 also protects the LOCOS oxide layer 118 during deglaze operations.

A charge balance layer 130 of p-type semiconductor material may be disposed in the substrate 102 extending under the lightly-doped drain layer 122 and the body region 108. The charge balance layer 130 may be 2 microns to 4 microns thick and may have an average dopant density of $1 \times 10^{16}$ cm$^{-3}$ to $4 \times 10^{16}$ cm$^{-3}$, for example. P-type semiconductor material 132 above the charge balance layer 130 may be epitaxial silicon having an average dopant density less than the average dopant density of the charge balance layer 130.

In one version of the instant example, the NMOS transistor 106 may optionally be isolated from the p-type semiconductor material 104 by an isolation structure 134. The isolation structure 134 may include an n-type buried layer 136 under the charge balance layer 130, and a deep n-type well 138 laterally surrounding the NMOS transistor 106 and connecting to the n-type buried layer 136. An isolation contact region 140 may be disposed in the substrate 102 connecting to the deep n-type well 138 to provide a low resistance electrical connection to the isolation structure 134. The isolation contact region 140 may include n-type semiconductor material having an average dopant density similar to the drain contact regions 124 or the source region 112, as a result of being formed concurrently with the drain contact regions 124 or the source region 112. The metal silicide 126 may also be disposed on the isolation contact region 140. In one version of the instant example, the lightly-doped drain layer 122 may extend to the isolation structure 134, as depicted in FIG. 1A, advantageous for operating the NMOS transistor 106 in a high-side configuration. In another version, the lightly-doped drain layer 122 may be laterally separated from the isolation structure 134 by a portion of the p-type semiconductor material 132, so that the drain contact region 124 may be operated at a different potential than the isolation contact region 140, advantageous for operating the NMOS transistor 106 in an isolated transistor configuration.

Other architectures for the isolation structure 134, such as a buried oxide layer under the charge balance layer 130, combined with a deep trench laterally surrounding the NMOS transistor 106, are within the scope of the instant example.

A field oxide layer 142 may be disposed on the substrate 102 outside of the drain contact regions 124, extending to the isolation structure 134. The lightly-doped drain layer 122 may extend under the field oxide layer 142 to the isolation structure 134, as depicted in FIG. 1A. The field oxide layer 142 may have an STI structure, as depicted in FIG. 1A, or may have a LOCOS structure.

An interconnect region 144 is located over the substrate 102. The interconnect region 144 may include a pre-metal dielectric (PMD) layer 146, contacts 148 through the PMD layer 146, and interconnects 150 on the contacts 148. The contacts 148 make electrical connections through the metal silicide 126 to the body connection 110, the source region 112, the drain contact regions 124, and the isolation contact region 140.

The body region 108 may be biased independently of the source region 112, through the body connection 110, advantageously enabling greater control of an on-state current and an off-state current through the NMOS transistor 106. The gate 120 extending over the LOCOS oxide layer 118 reduces an electric field in the lightly-doped drain layer 122 compared to a similar transistor with a thicker oxide layer, enabling a reduced length of the lightly-doped drain layer 122, which advantageously reduces an area of the NMOS transistor 106. Laterally isolating the body connection 110 from the source region 112 by the STI oxide layer 114 advantageously reduces space compared to a LOCOS isolation oxide.

In a version of the instant example which includes the isolation structure 134, the NMOS transistor 106 may be operated in a high-side configuration. During operation of the semiconductor device 100, the body region 108 may be maintained at a potential significantly higher, for example, 10 volts to 30 volts higher, than the p-type semiconductor material 104 of the substrate 102. The isolation structure 134 blocks current flow from the body region 108 to the p-type semiconductor material 104, advantageously reducing power consumption in the semiconductor device 100.

Figure 2A:
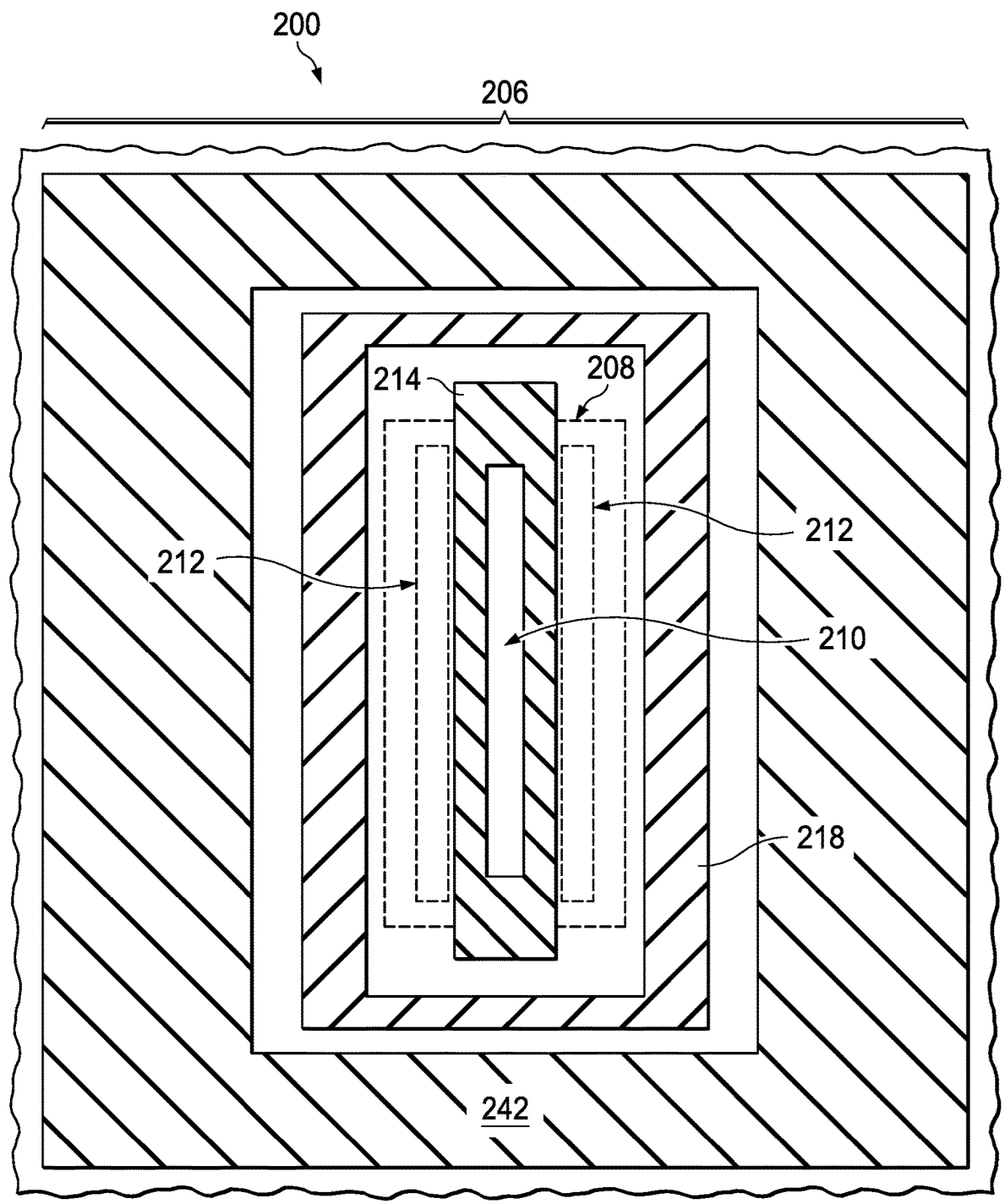
FIG. 2A through FIG. 2C are top views of an example semiconductor device which includes an NMOS transistor.
Figure 2B:
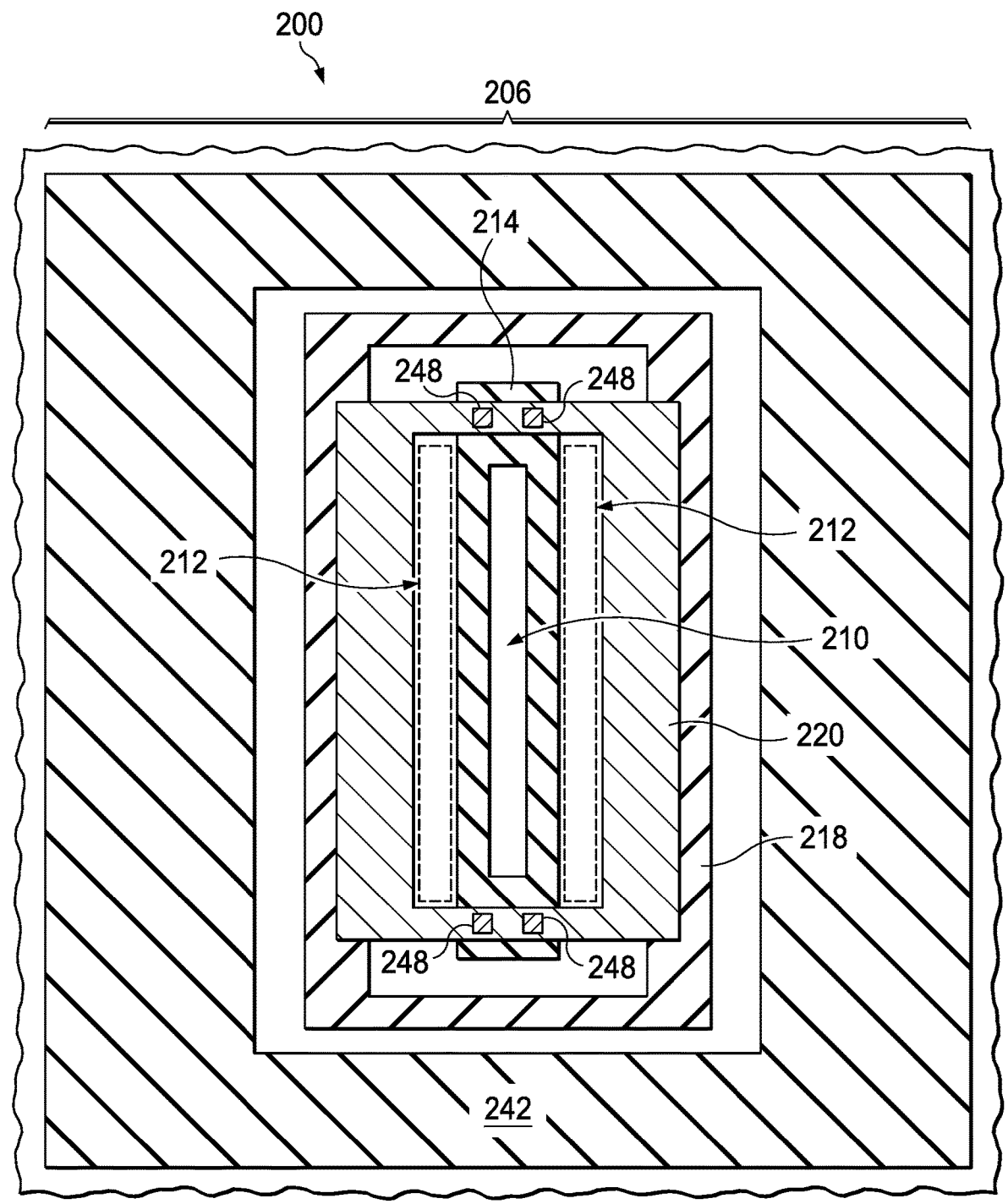
Figure 2C:
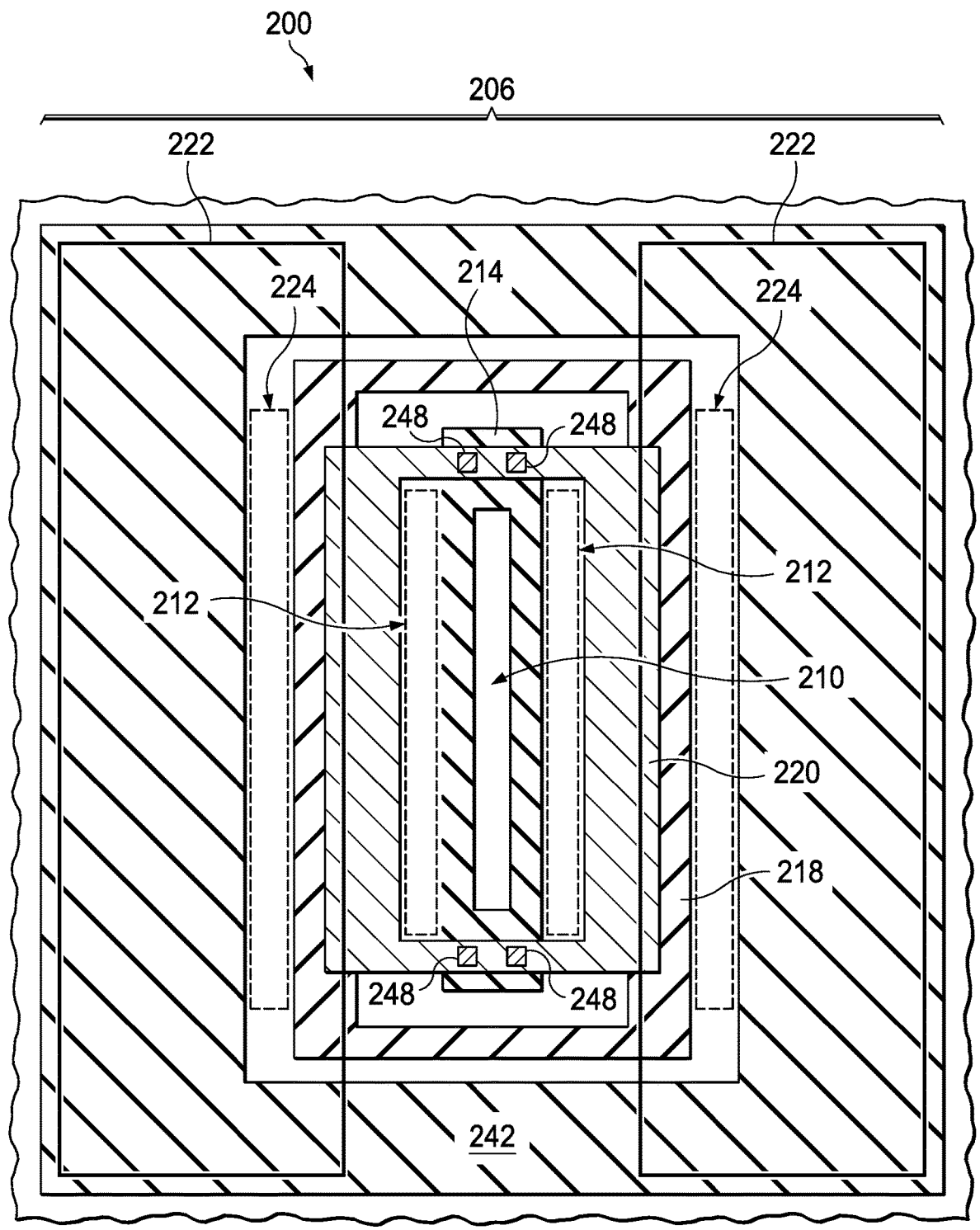

FIG. 2A through FIG. 2C are top views of an example semiconductor device which includes an NMOS transistor. The order of introduction of elements of the semiconductor device 200 in reference to FIG. 2A through FIG. 2C is not reflective of an order of formation of those elements. The disclosure in reference to FIG. 2A through FIG. 2C is offered to further clarify the structure of the semiconductor device 200. Referring to FIG. 2A, the semiconductor device 200 of the instant example includes a single finger configuration of the NMOS transistor 206. The NMOS transistor 206 has an STI oxide layer 214 with a closed-loop configuration that laterally surrounds an area for a body connection 210. Areas for a source region 212 are located outside of, and adjacent to, the STI oxide layer 214. An area for a body region 208 extends past the area for the body connection 210 and the areas for the source region 212. The NMOS transistor 206 further includes a LOCOS oxide layer 218 with a closed-loop configuration that laterally surrounds the STI oxide layer 214 and the areas for the source region 212. The LOCOS oxide layer 218 is laterally separated from the STI oxide layer 214, and lies outside the area for the body region 208. The NMOS transistor 206 may also include a field oxide layer 242 outside of, and laterally separated from, the LOCOS oxide layer 218. The field oxide layer 242 may have an STI structure or a LOCOS structure.

Referring to FIG. 2B, the NMOS transistor 206 includes a gate 220 with a closed-loop configuration that laterally surrounds the area for the body connection 210 and the areas for the source region 212. The gate 220 lies over a perimeter of the area for the body region 208 of FIG. 2A. The gate 220 extends partway over the LOCOS oxide layer 218. The gate 220 may extend over the STI oxide layer 214 at ends of the STI oxide layer 214 away from the areas for the source region 212. Contacts 248 may be formed on the gate 220 where the gate 220 overlaps the STI oxide layer 214, advantageously avoiding degradation of the NMOS transistor 206. Forming contacts to a gate over an active area may damage the underlying gate dielectric layer, or may cause mechanical stress in the underlying semiconductor material.

Referring to FIG. 2C, a lightly-doped drain layer 222, shown in outline in FIG. 2C, is disposed on opposite sides of the NMOS transistor 206, extending partway under the LOCOS oxide layer 218. In the instant example, the lightly-doped drain layer 222 may have a disjoint configuration, that is, portions of the lightly-doped drain layer 222 on opposite sides of the NMOS transistor 206 are not continuous with each other. Areas for drain contact regions 224 are located outside of the LOCOS oxide layer 218, and over the lightly-doped drain layer 222. Lateral dimensions of the elements of the NMOS transistor 206 may be selected to provide desired values of on-state current and operating voltage.

Figure 3A:
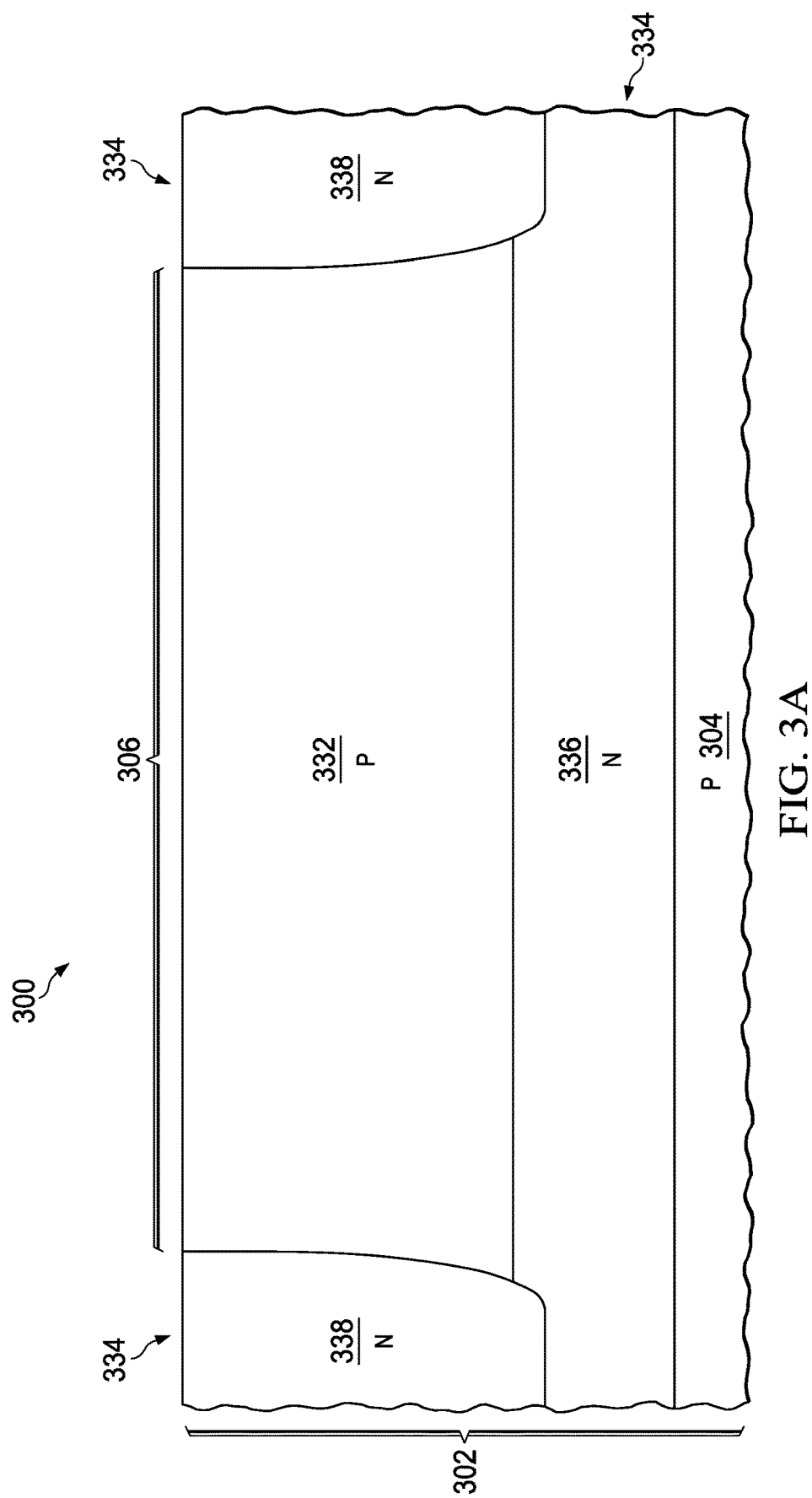
FIG. 3A through FIG. 3I are cross sections of a semiconductor device including an NMOS transistor, depicted in stages of an example method of formation.

FIG. 3A through FIG. 3I are cross sections of a semiconductor device including an NMOS transistor, depicted in stages of an example method of formation. Referring to FIG. 3A, the semiconductor device 300 has a substrate 302 which may be, for example, a silicon wafer or other semiconductor substrate. The substrate 302 includes a semiconductor material 304, for example, a p-type base layer. An n-type buried layer 336 is formed over the semiconductor material 304. The n-type buried layer 336 may be formed by implanting n-type dopants such as antimony or arsenic into the semiconductor material 304, followed by annealing the semiconductor material 304 and forming an epitaxial layer which includes p-type epitaxial semiconductor material 332 over the semiconductor material 304, so that the n-type buried layer 336 is formed at a boundary between the p-type epitaxial semiconductor material 332 and the semiconductor material 304, extending partway into both. The substrate 302 includes the epitaxial layer, with the p-type epitaxial semiconductor material 332 and the n-type buried layer 336.

A deep n-type well 338 is formed in the substrate 302, extending to the n-type buried layer 336. The deep n-type well 338 laterally surrounds an area for the NMOS transistor 306. The deep n-type well 338 combined with the n-type buried layer 336 provide an isolation structure for the subsequently-formed NMOS transistor 306.

Figure 3B:
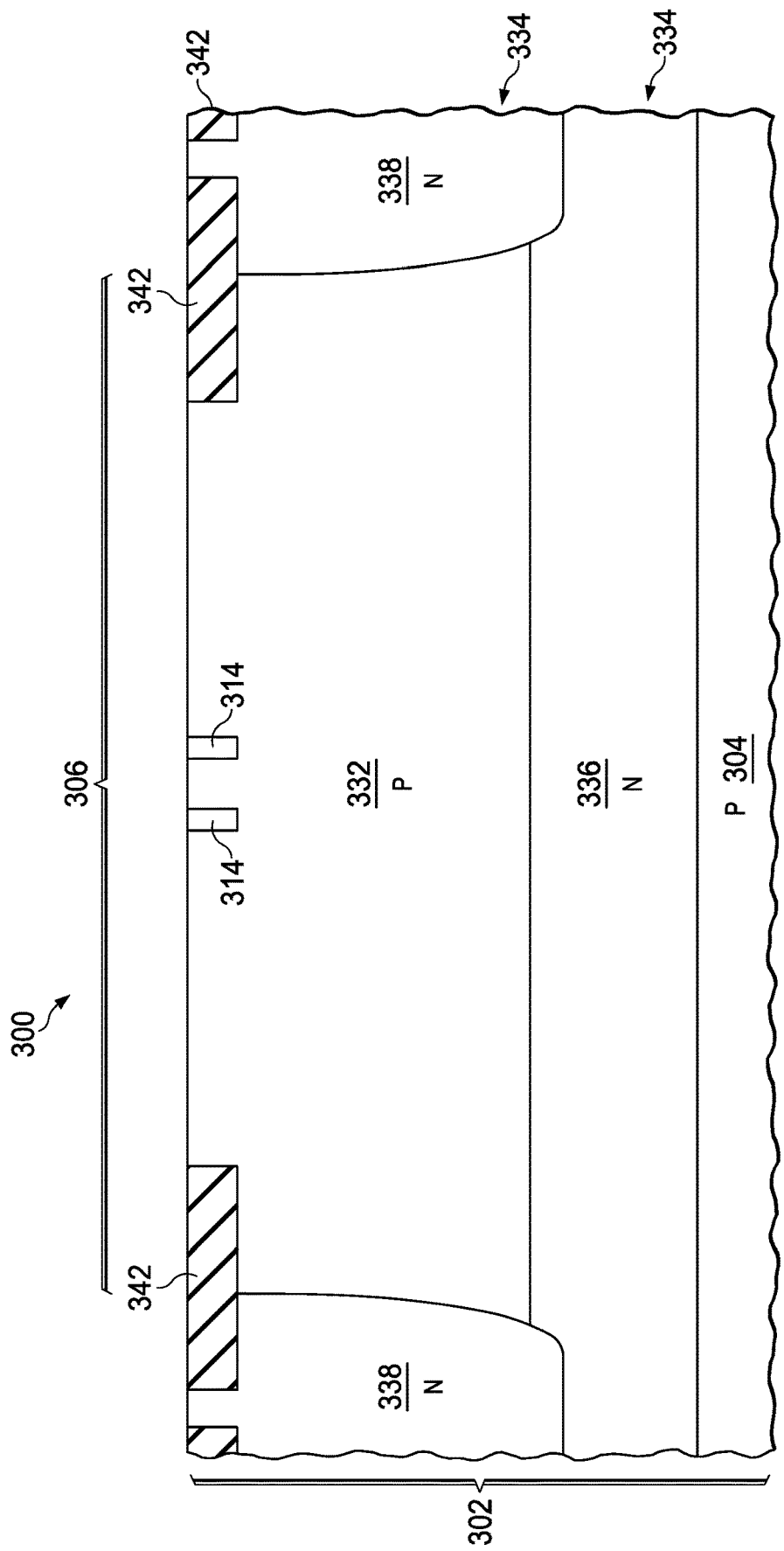

Referring to FIG. 3B, an STI oxide layer 314 and a field oxide layer 342 are formed concurrently by an STI process. The STI oxide layer 314 is located in a source area of the NMOS transistor 306 and has a closed-loop configuration. The field oxide layer 342 is located outside of the STI oxide layer 314 and extends to the isolation structure. An example STI process includes forming a chemical mechanical polish (CMP) stop layer of silicon nitride over the substrate 302, etching isolation trenches through the CMP stop layer and into the substrate 302, and filling the isolation trenches with silicon dioxide using a plasma enhanced chemical vapor deposition (PECVD) process using tetraethyl orthosilicate (TEOS), a high density plasma (HDP) process, a high aspect ratio process (HARP) using TEOS and ozone, an atmospheric chemical vapor deposition (APCVD) process using silane, or a subatmospheric chemical vapor deposition (SACVD) process using dichlorosilane. Excess silicon dioxide is removed from over the CMP stop layer by an oxide CMP process, and the CMP stop layer is subsequently removed, leaving the STI oxide layer 314 and the field oxide layer 342. A layer of pad oxide, not shown in FIG. 3B, may be present on the substrate 302 to protect the p-type epitaxial semiconductor material 332 from damage during subsequent process steps.

In an alternate version of the instant example, the field oxide layer 342 may be formed separately from the STI oxide layer 314. For one example, it may be desired that the field oxide layer 342 have an STI structure with a different thickness than the STI oxide layer 314, and so the field oxide layer 342 may be formed by a separate STI process. For another example, it may be desired that the field oxide layer 342 have a LOCOS structure, and so the field oxide layer 342 may be formed by a LOCOS process.

Figure 3C:
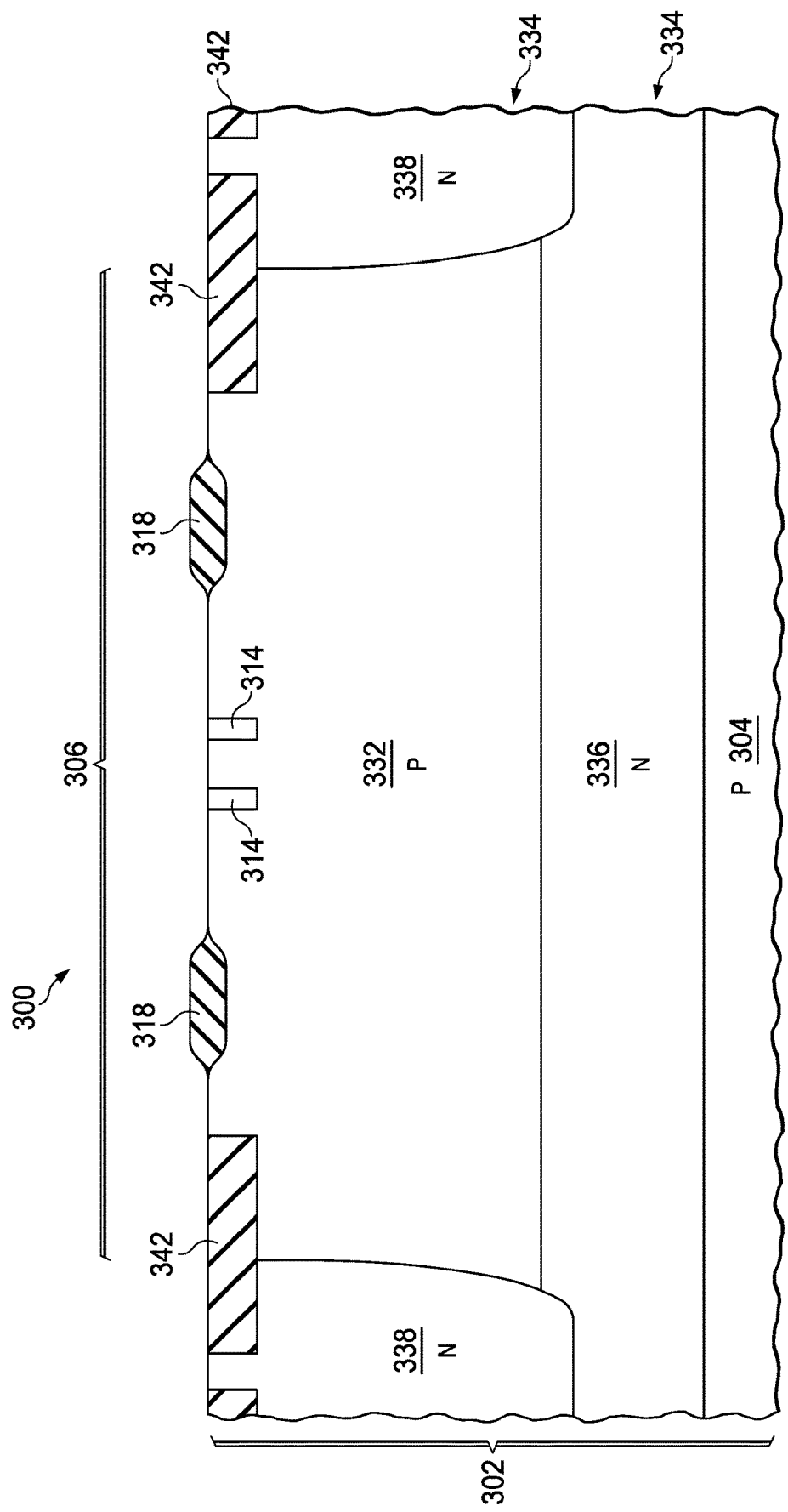

Referring to FIG. 3C, a LOCOS oxide layer 318 is formed on the substrate 302 by a LOCOS process. An example LOCOS process includes forming a silicon nitride mask layer over a layer of LOCOS pad oxide over the substrate 302. The silicon nitride mask layer is removed in areas for the LOCOS oxide layer 318, exposing the LOCOS pad oxide. Silicon dioxide is formed in the areas exposed by the silicon nitride mask layer by thermal oxidation, to form the LOCOS oxide layer 318. The silicon nitride mask layer is subsequently removed, leaving the LOCOS oxide layer 318 in place. The LOCOS oxide layer 318 has a closed-loop configuration and laterally surrounds, and is laterally separated from, the STI oxide layer 314. Moreover, the LOCOS oxide layer 318 lies inside of, and is laterally separated from, the field oxide layer 342.

Figure 3D:
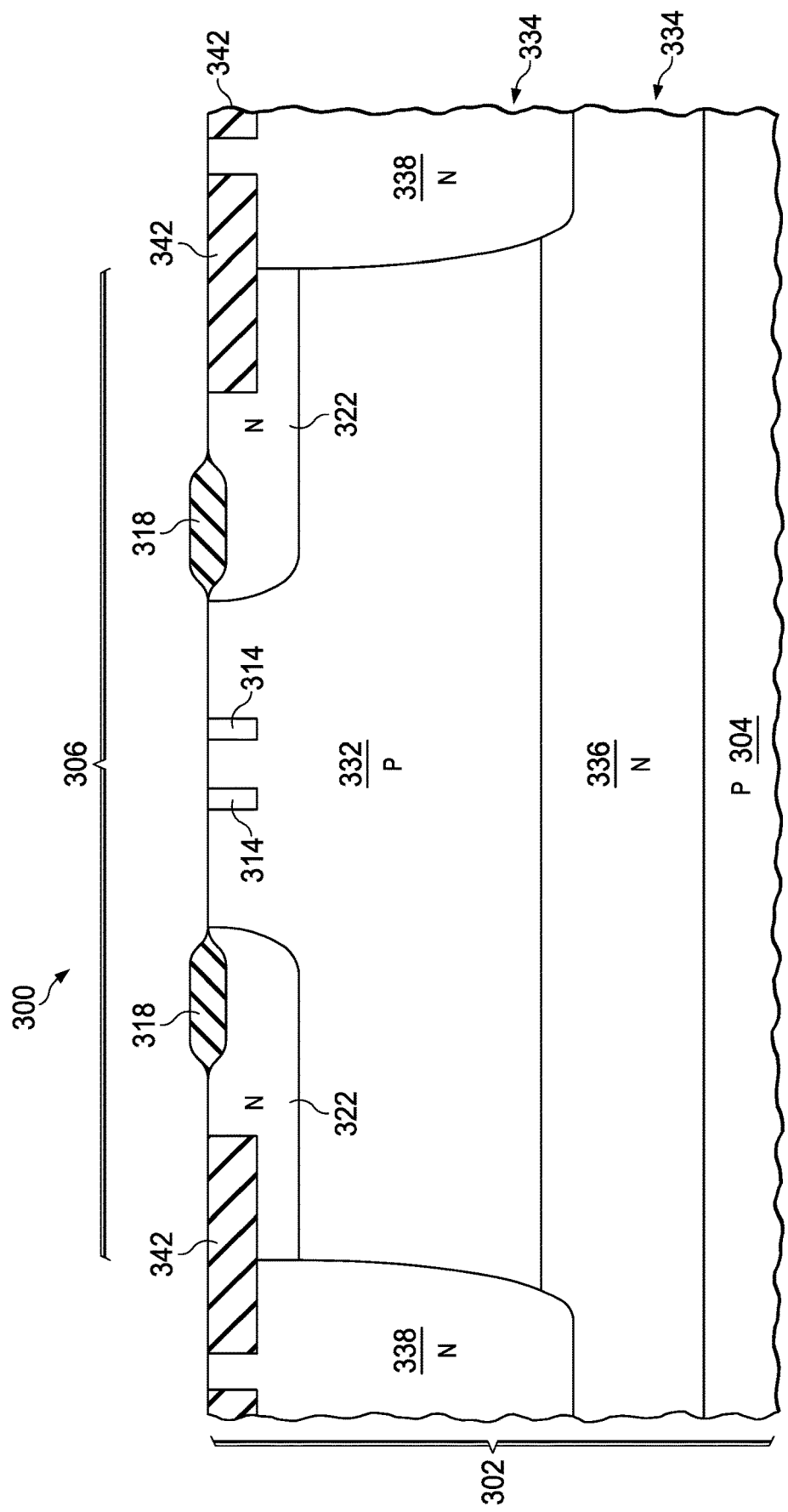

Referring to FIG. 3D, n-type dopants such as phosphorus are implanted into the substrate 302 in areas for a lightly-doped drain layer 322 of the NMOS transistor 306. The n-type dopants may be implanted in one or more steps at a total dose of $1 \times 10^{12}$ cm$^{-2}$ to $5 \times 10^{13}$ cm$^{-2}$, for example. The implanted n-type dopants extend below the field oxide layer 342. The substrate 302 is subsequently annealed, causing the implanted n-type dopants to diffuse in the substrate 302 and become activated, so that the lightly-doped drain layer 322 extends from the isolation structure 334, under the field oxide layer 342, under the LOCOS oxide layer 318, to a location between the LOCOS oxide layer 318 and the STI oxide layer 314.

Figure 3E:
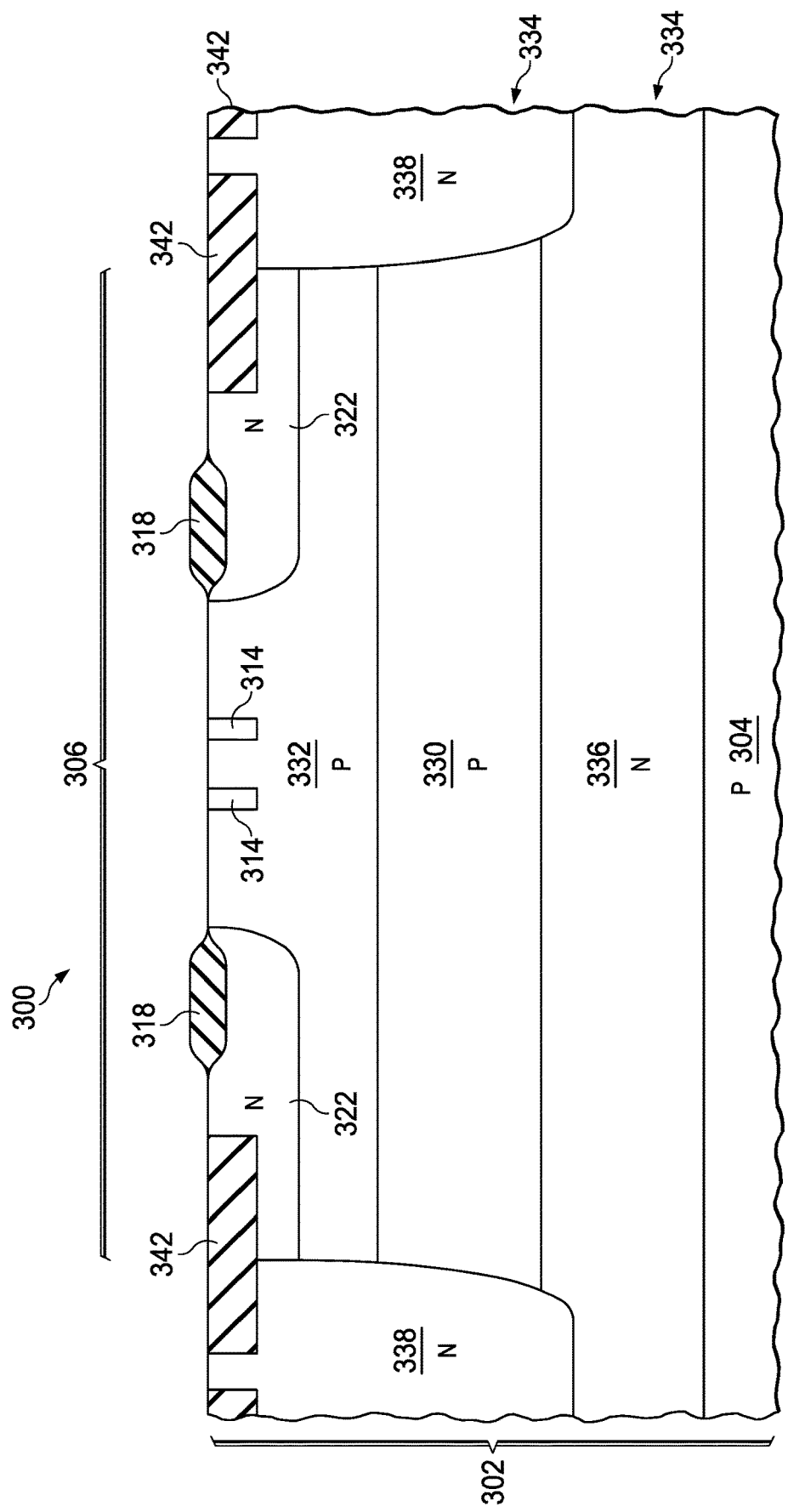

Referring to FIG. 3E, a charge balance layer 330 is formed by implanting p-type dopants such as boron, optionally in more than one step, at a total dose of $1 \times 10^{12}$ cm$^{-2}$ to $5 \times 10^{13}$ cm$^{-2}$, for example. One or more of the implants steps may use an implant mask to restrict an area of the implanted dopants. The substrate 302 is subsequently annealed, for example, at 900° C. to 1000° C. for 20 minutes to 60 minutes, to diffuse and activate the implanted p-type dopants.

Figures 1, 3F:
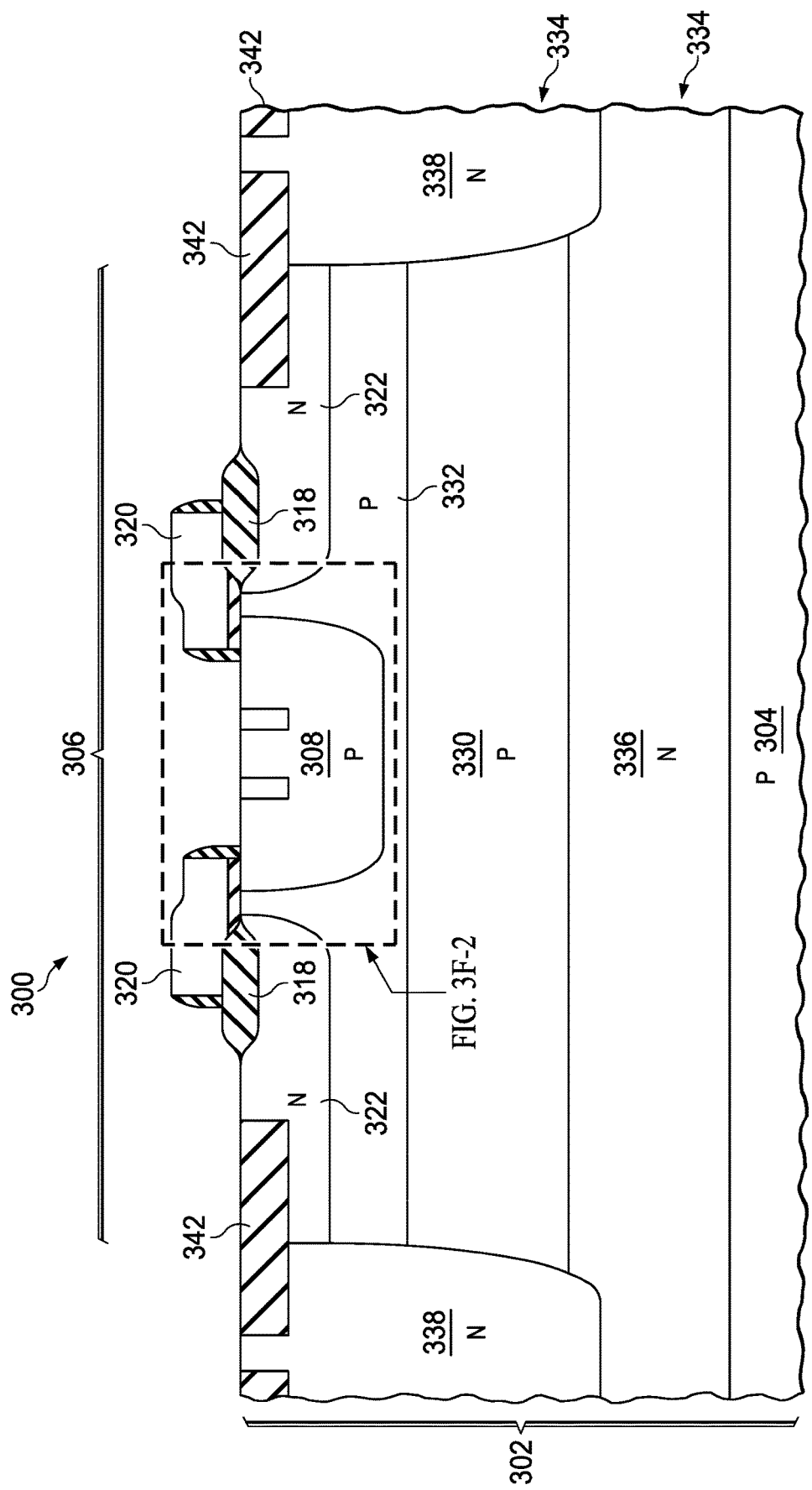
Figures 2, 3F:
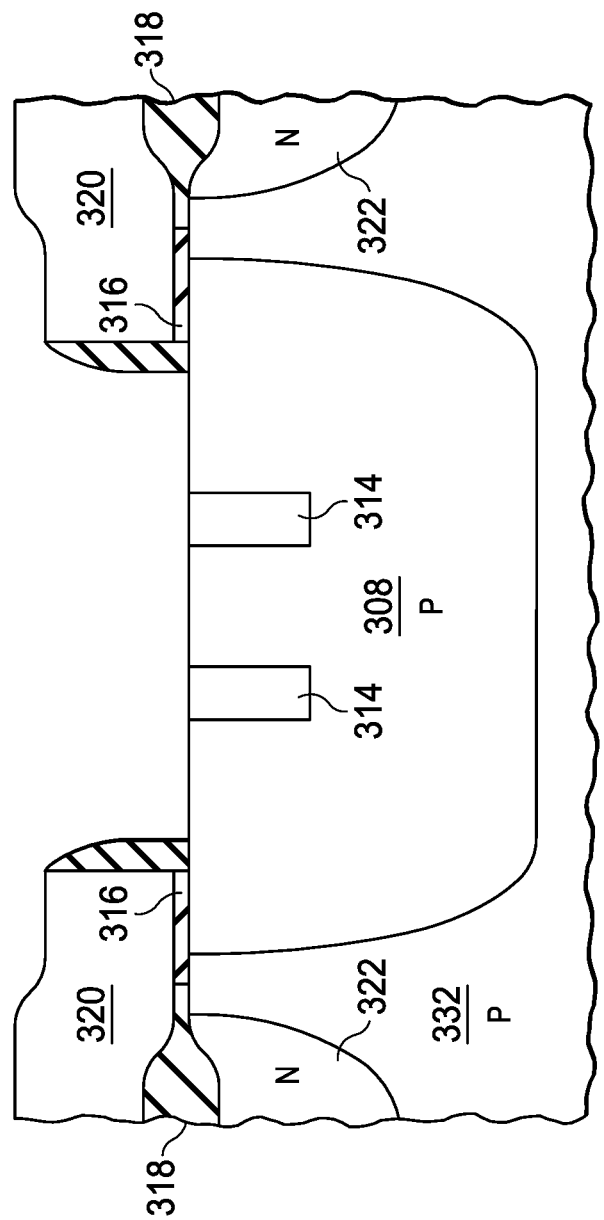

Referring to FIG. 3F, a body region 308 is formed in the substrate 302 under the STI oxide layer 314. The body region 308 may be formed by implanting p-type dopants such as boron at a total dose of $3 \times 10^{13}$ cm$^{-2}$ to $1 \times 10^{15}$ cm$^{-2}$, using a body implant mask, followed by annealing the substrate 302.

A gate dielectric layer 316 is formed on the substrate 302 extending from the LOCOS oxide layer 318 over the body region 308. The gate dielectric layer 316 may be formed by a thermal oxidation process, and may further include nitridation by exposure to a nitrogen-containing plasma. Forming the gate dielectric layer 316 may include formation of a high-k dielectric layer of hafnium oxide, tantalum oxide, or zirconium oxide.

A gate 320 is formed over the gate dielectric layer 316, extending partway over the LOCOS oxide layer 318. In one version of the instant example, the gate 320 may be formed by forming a polysilicon layer over the substrate 302, and subsequently forming a gate etch mask over the polysilicon layer. A gate reactive ion etch (ME) process then removes the polysilicon layer where exposed by the gate etch mask, leaving the gate 320 in place. In another version of the instant example, the gate 320 may be formed by forming a dielectric layer over the substrate 302, and removing material from the dielectric layer in areas for the gate 320. Gate material, such as metal layers including titanium, titanium nitride, tantalum, tantalum nitride, or aluminum, is formed over the dielectric layer and in the areas for the gate 320. The gate material is subsequently removed from over the dielectric layer, leaving the gate 320 in place. Other methods of forming the gate 320, such as a fully silicided (FUSI) gate process, are within the scope of the instant example. Sidewall spacers may be formed on lateral surfaces of the gate 320. The sidewall spacers may be formed by forming a conformal layer of dielectric material over the gate 320 and the substrate 302, followed by an anisotropic etch to remove the dielectric material from tops of the gate 320 and the substrate 302.

At this point, n-type source extensions, not shown in FIG. 3F, may be formed in the substrate 302 adjacent to the gate 320. Gate sidewall spacers, also not shown in FIG. 3F, may be formed on lateral surfaces of the gate 320.

Figures 1, 3G:
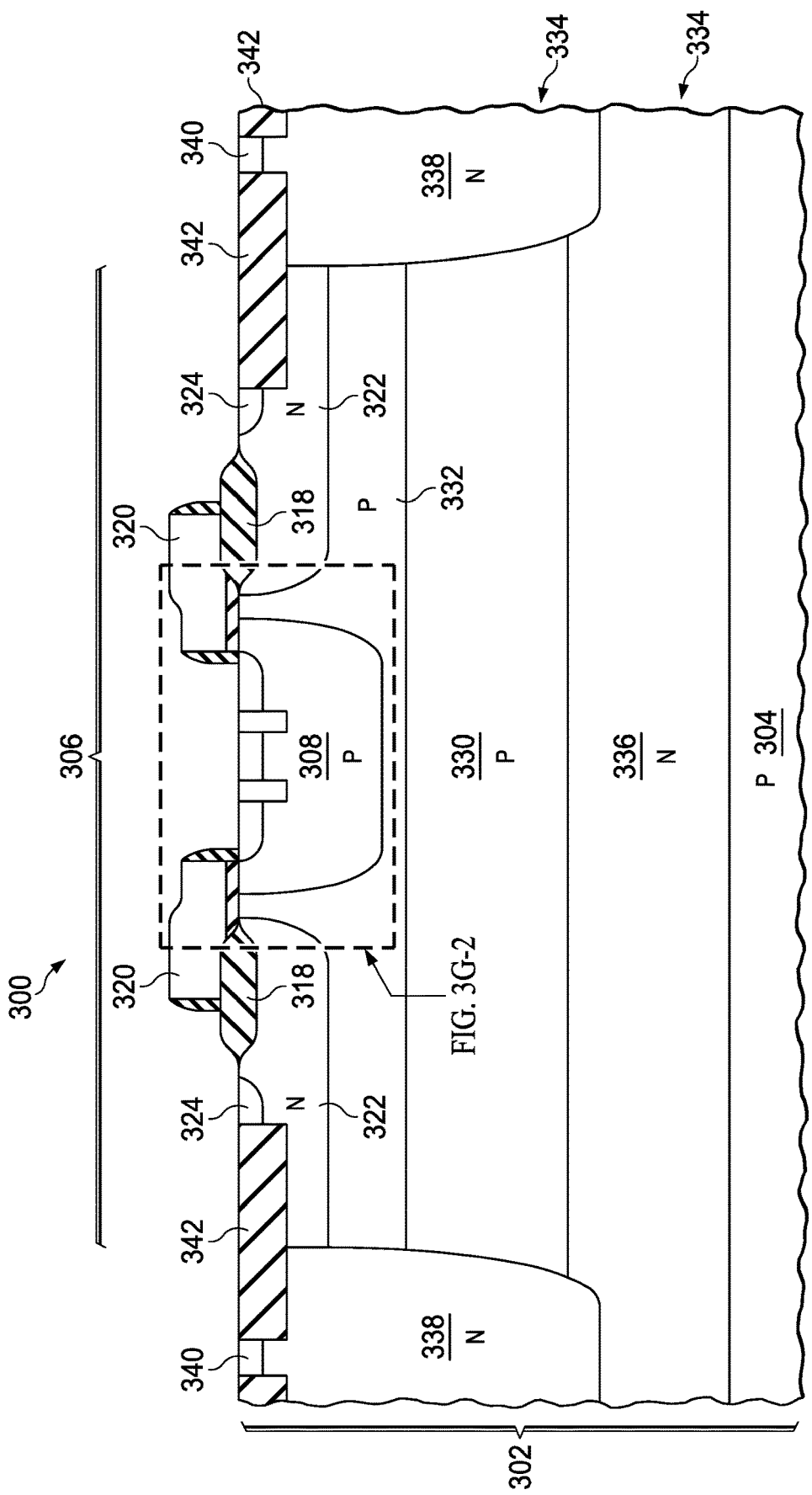
Figures 2, 3G:
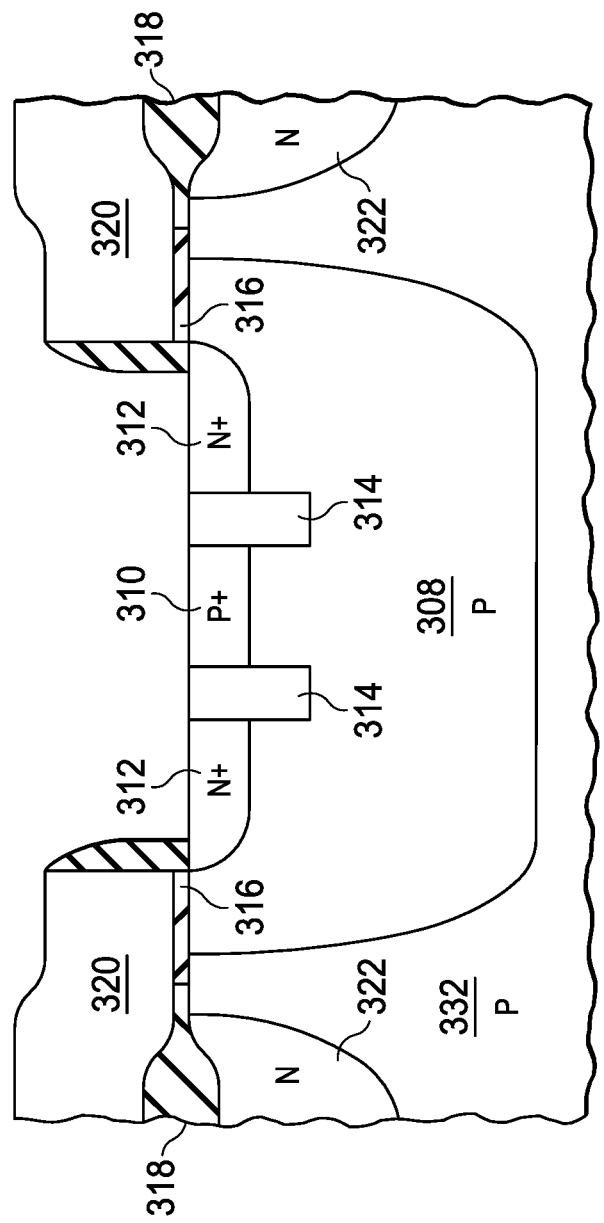

Referring to FIG. 3G, a body connection 310 is formed in the substrate 302 inside the loop of the STI oxide layer 314. The body connection 310 may be formed by implanting p-type dopants such as boron, gallium or indium, at a total dose of $1 \times 10^{14}$ cm$^{-2}$ to $1 \times 10^{16}$ cm$^{-2}$, using an implant mask, followed by annealing the substrate 302. The body connection 310 may be formed concurrently with sources and drains of p-channel metal oxide semiconductor (PMOS) transistors in the semiconductor device 300.

A source region 312 is formed in the substrate 302 between the STI oxide layer 314 and the gate 320. Drain contact regions 324 are formed in the substrate 302 on the lightly-doped drain layer 322 outside the LOCOS oxide layer 318, for example, between the LOCOS oxide layer 318 and the field oxide layer 342. Isolation contact regions 340 may be formed in the substrate 302 on the deep n-type well 338. The source region 312, the drain contact regions 324, and the isolation contact regions 340 may be formed concurrently by implanting n-type dopants such as phosphorus, arsenic, and antimony, at a total dose of $3 \times 10^{14}$ cm$^{-2}$ to $2 \times 10^{16}$ cm$^{-2}$, using an implant mask, followed by annealing the substrate 302. The source region 312, the drain contact regions 324, and the isolation contact regions 340 may be formed concurrently with sources and drains of other NMOS transistors in the semiconductor device 300. Annealing the substrate 302 after implanting the p-type dopants for the body connection 310 may be combined with annealing the substrate 302 after implanting the n-type dopants for the source region 312, the drain contact regions 324, and the isolation contact regions 340.

Figures 1, 3H:
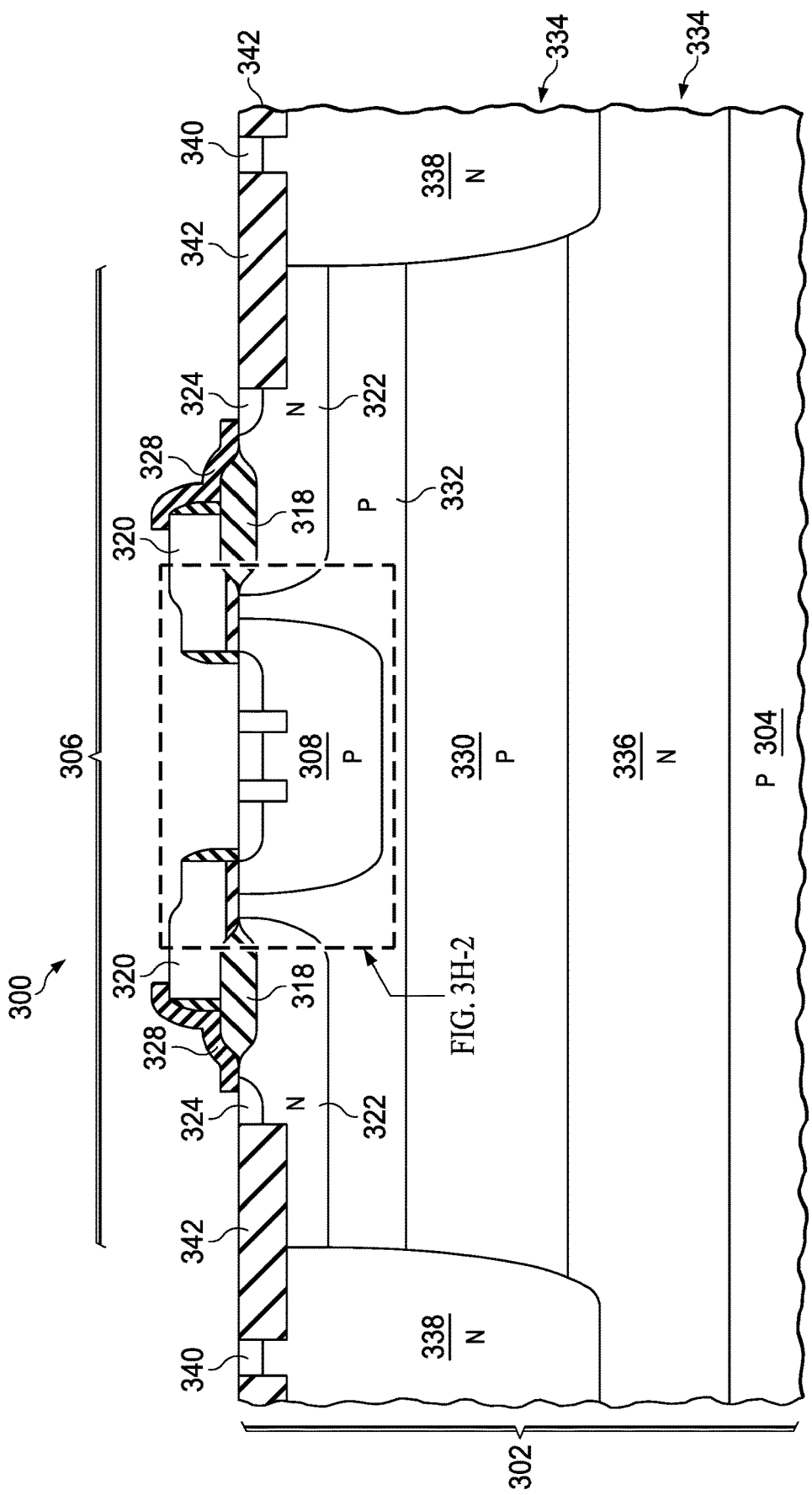
Figures 2, 3H:
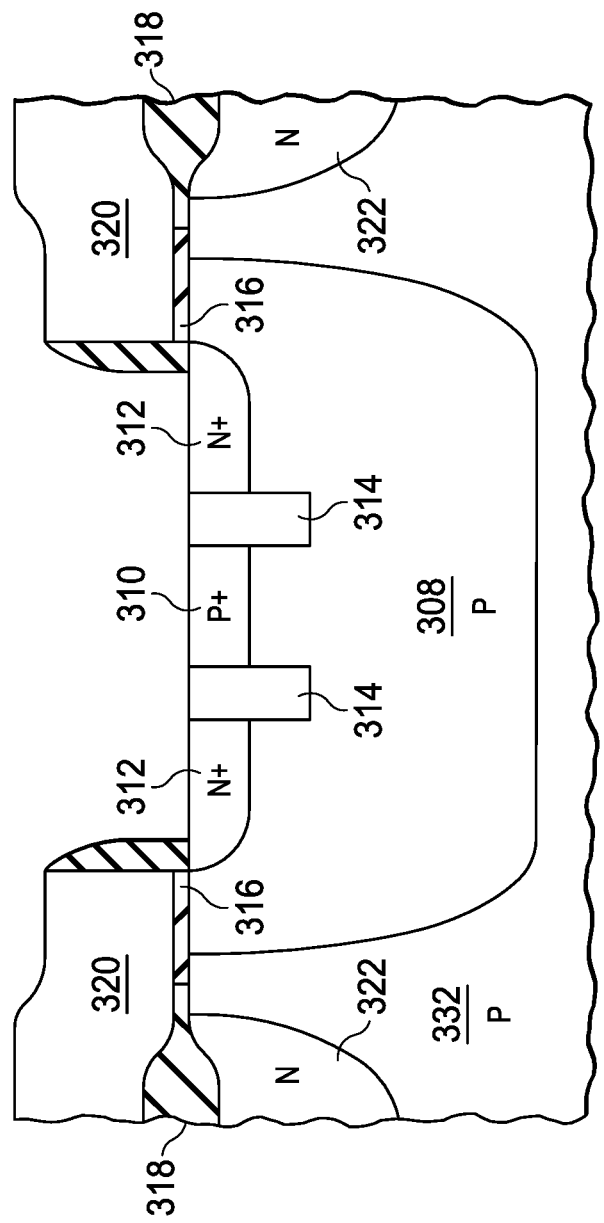

Referring to FIG. 3H, a silicide block layer 328 is formed on a boundary between the LOCOS oxide layer 318 and the lightly-doped drain layer 322, extending partway on the LOCOS oxide layer 318 and partway on the lightly-doped drain layer 322, partially overlapping the drain contact regions 324. The silicide block layer 328 may include primarily silicon dioxide, and may be free of silicon nitride and silicon oxy-nitride, to reduce charge trapping. The silicide block layer 328 prevents metal silicide formation at the boundary between the LOCOS oxide layer 318 and the lightly-doped drain layer 322. Metal silicide at that boundary may result in an increased electric field in the lightly-doped drain layer 322, leading to reliability degradation of the NMOS transistor 306. The silicide block layer 328 may be formed by depositing a layer of silicon dioxide, optionally densifying the silicon dioxide, and patterning the layer of silicon dioxide by a masked etch process.

Figures 1, 3I:
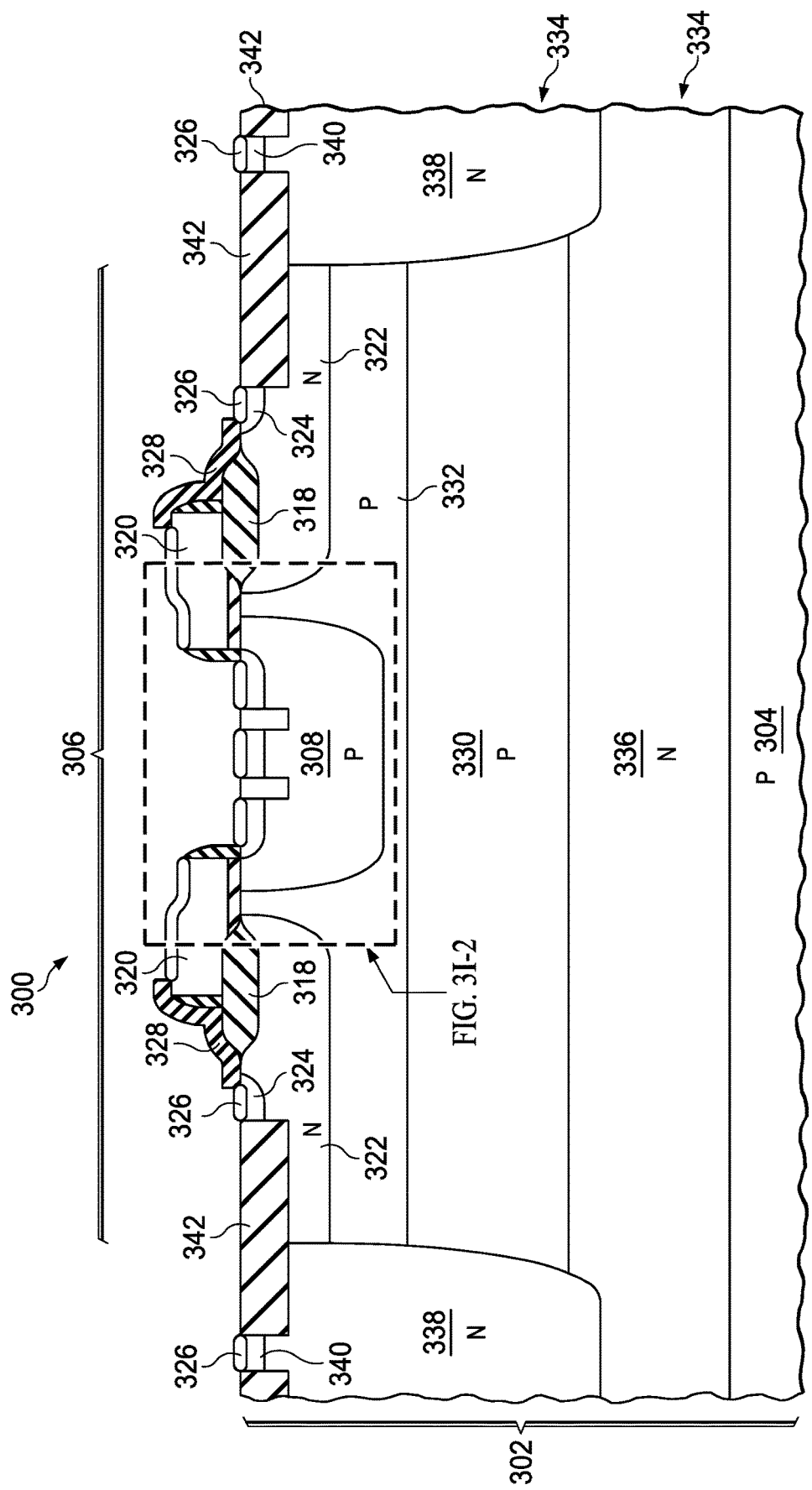
Figures 2, 3I:
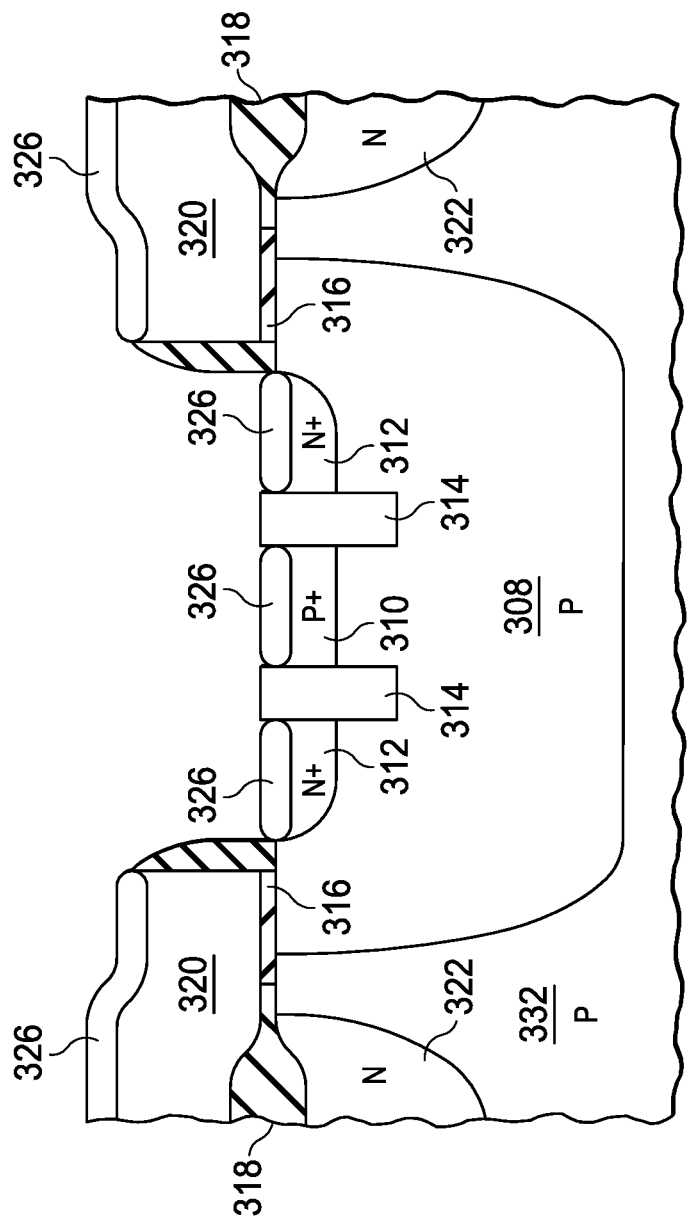

Referring to FIG. 3I, metal silicide 326 is formed on the body connection 310, on the source region 312, on the drain contact regions 324 where exposed by the silicide block layer 328, on the isolation contact regions 340, and on the gate 320. An example process for forming the metal silicide 326 includes forming a refractory metal layer including cobalt or nickel on an instant top surface of the semiconductor device 300, so that the refractory metal contacts exposed silicon on the body connection 310, the source region 312, the drain contact regions 324, the isolation contact regions 340, and the gate 320. A cap layer of titanium nitride may be formed over the refractory metal to provide a diffusion barrier. The refractory metal is subsequently heated, for example, in a rapid thermal processor, to react the refractory metal with the exposed silicon to form the metal silicide 326. Unreacted refractory metal is removed, for example, by a wet etch using aqueous solutions of acidic or basic reagents. The metal silicide 326 may be subsequently annealed to provide a desired crystalline phase.

The elements of the NMOS transistor 306 and the isolation structure 334, that is, the body region 308, the lightly-doped drain layer 322, the charge balance layer 330, the n-type buried layer 336, the deep n-type well 338, the STI oxide layer 314 and the LOCOS oxide layer 318, may be formed concurrently with similar elements in other components of the semiconductor device 300, advantageously reducing fabrication cost and complexity of the semiconductor device 300. Formation of the semiconductor device 300 is continued with formation of an interconnect region over the substrate 302. The interconnect region includes one or more dielectric layers, with contacts, interconnects, and vias in the dielectric layers to provide electrical connections to the NMOS transistor 306 and the other components of the semiconductor device 300.

Figure 4A:
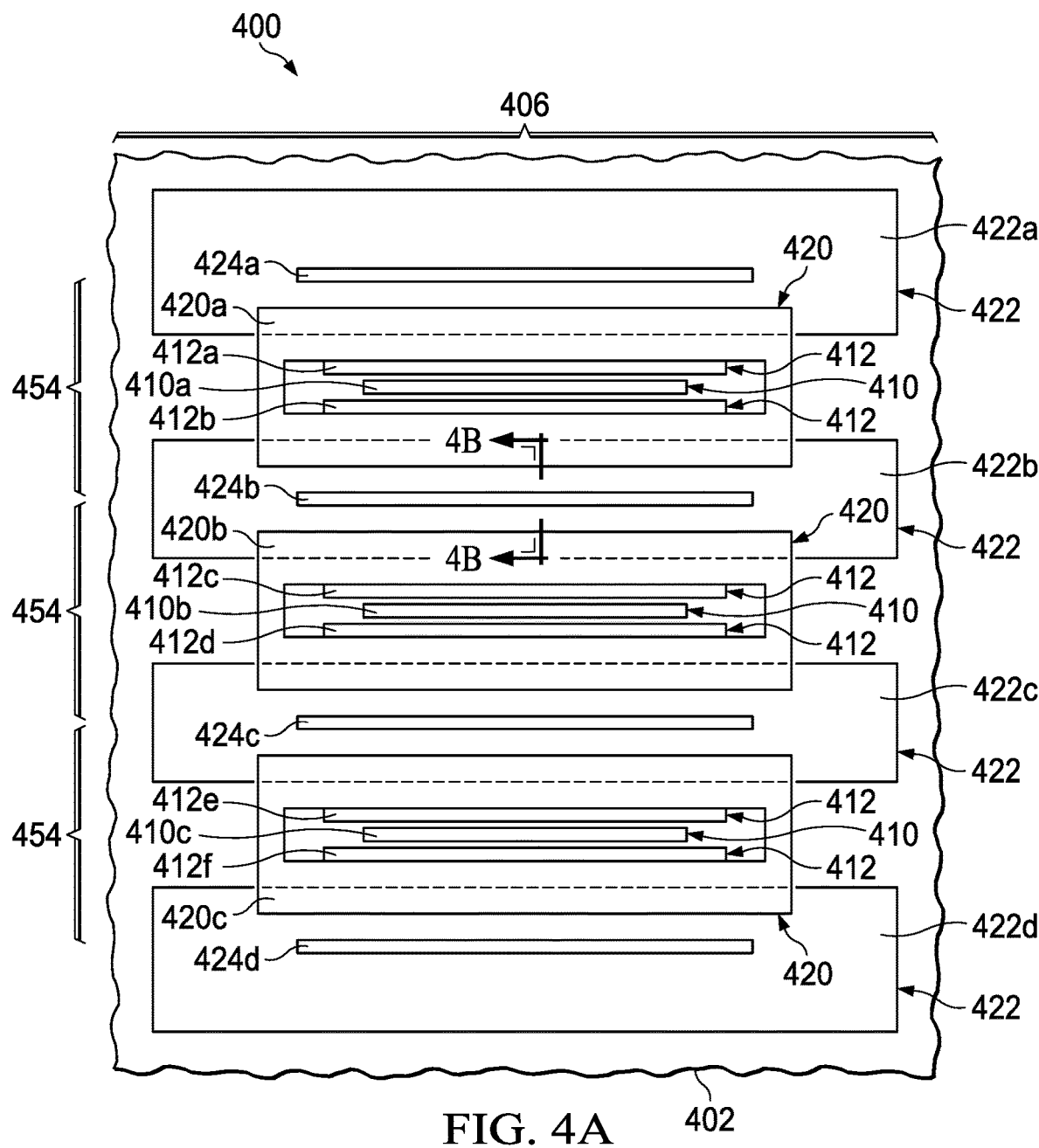
FIG. 4A and FIG. 4B are views of an example semiconductor device including an NMOS transistor having a multiple finger configuration.
Figure 4B:
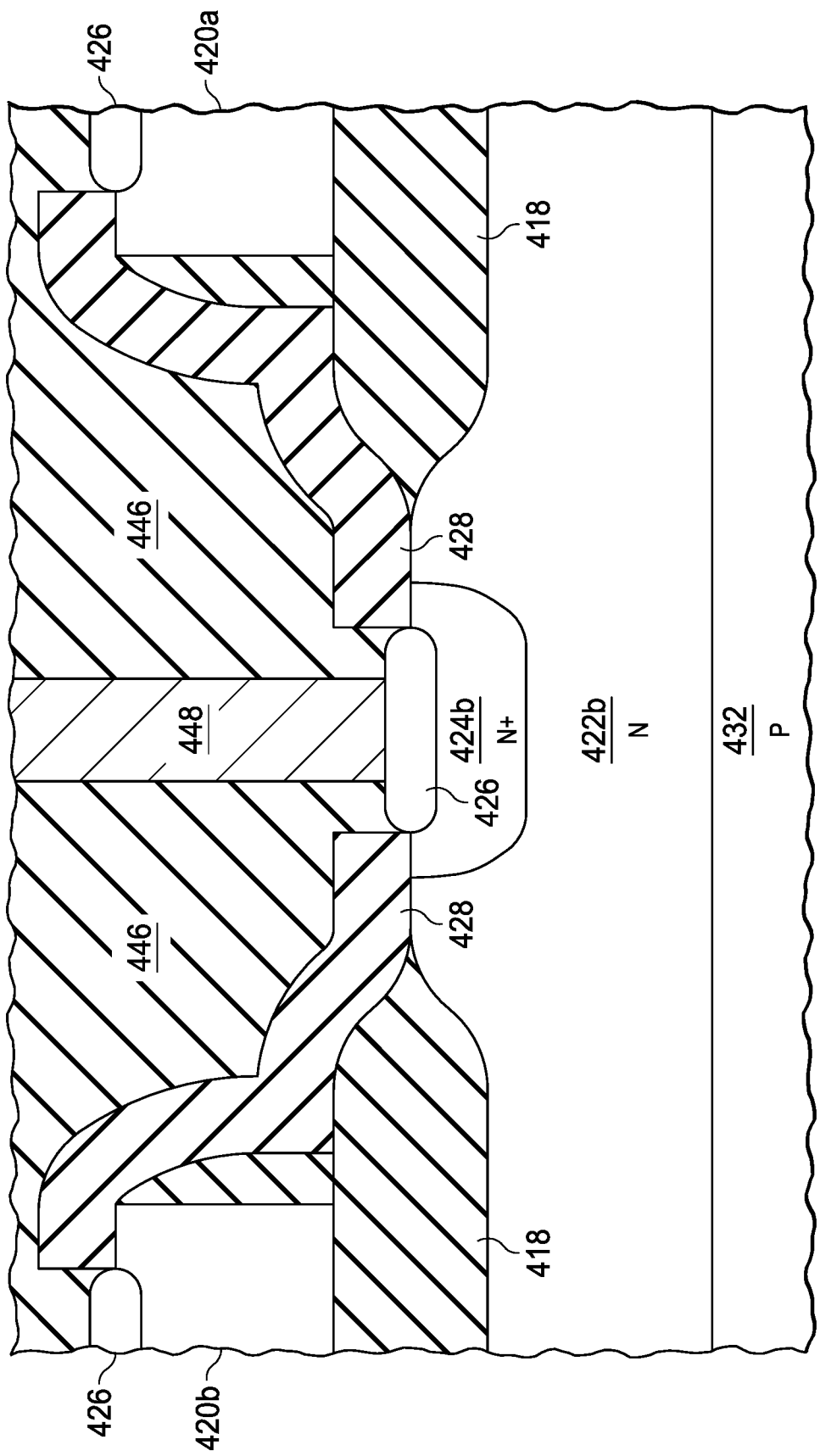

FIG. 4A and FIG. 4B are views of an example semiconductor device including an NMOS transistor having a multiple finger configuration. Referring to FIG. 4A, which is a top view, the semiconductor device 400 includes a substrate 402 that has a semiconductor material, for example, as described in reference to FIG. 1A. The NMOS transistor 406 of the instant example has three fingers 454.

The NMOS transistor 406 has a body connection 410 which is divided into three segments 410a, 410b, and 410c, with one segment 410a, 410b, or 410c in each finger 454. The NMOS transistor 406 has a source region 412 in the substrate 402. The source region 412 is divided into six source segments 412a, 412b, 412c, 412d, 412e, and 412f in the instant example, with two of the source segments 412a, 412b, 412c, 412d, 412e, or 412f in each finger 454, arranged on opposite sides of the body connection segment 410a, 410b, or 410c in that finger 454. In the instant example, source segments 412a and 412b are located on opposite sides of the body connection segment 410a, and so on.

The NMOS transistor 406 includes a gate 420 which is divided into three segments 420a, 420b, and 420c, with one of the gate segments 420a, 420b, or 420c in each finger 454. Each gate segment 420a, 420b, and 420c has a closed loop configuration as shown in FIG. 4A. Each gate segment 420a, 420b, and 420c laterally surrounds two of the source segments 412a, 412b, 412c, 412d, 412e, and 412f, and laterally surrounds one of the body connection segments 410a, 410b, or 410c; in the instant example, gate segment 420a laterally surrounds source segments 412a and 412b and body connection segment 410a, and so on. The two source segments 412a and 412b may optionally be connected to each other by n-type semiconductor material, for example, around ends of the body connection segment 410a, and similarly for the other source segments 412c, 412d, 412e, and 412f.

The NMOS transistor 406 includes a lightly-doped drain layer 422 in the substrate 402. The lightly-doped drain layer 422 is divided into four lightly-doped drain layer segments 422a, 422b, 422c, and 422d in the instant example. Each of the lightly-doped drain layer segments 422a, 422b, 422c, and 422d extend partway under adjacent instances of the gate segments 420a, 420b, and 420c. In the instant example, lightly-doped drain layer segment 422a extends partway under gate segment 420a proximate to source segment 412a. Further, in the instant example, lightly-doped drain layer segment 422b extends partway under gate segment 420a proximate to source segment 412b, and extends partway under gate segment 420b proximate to source segment 412c. And so on for the remaining lightly-doped drain layer segments 422c, and 422d. Thus, each finger 454 includes a portion of each of two lightly-doped drain layer segments 422a, 422b, 422c, or 422d, arranged on opposite sides of the gate segment 420a, 420b, or 420c in that finger 454.

The NMOS transistor 406 further includes drain contact regions 424a, 424b, 424c, and 424d in the substrate 402. Each of the drain contact regions 424a, 424b, 424c, and 424d is located on a corresponding lightly-doped drain layer segment 422a, 422b, 422c, or 422d. In the instant example, drain contact region 424a is located on lightly-doped drain layer segment 422a, proximate to gate segment 420a. Further in the instant example, drain contact region 424b is located on lightly-doped drain layer segment 422b, between gate segments 420a and 420b. The remaining drain contact regions 424c and 424d are similarly located on lightly-doped drain layer segments 422c and 422d.

The NMOS transistor 406 includes an STI oxide layer and a LOCOS oxide layer, divided into segments, one segment per finger 454, with each segment being characterized, for example, similarly to the STI oxide layer 114 and the LOCOS oxide layer 118 as described in reference to FIG. 1A and FIG. 1B. Furthermore, the NMOS transistor 406 includes a body region, which may be divided into body segments, one body segment per finger 454. Each body segment may be characterized for example, similarly to the body region 108 as described in reference to FIG. 1A and FIG. 1B. The NMOS transistor 406 also includes a gate dielectric layer, which may be divided into gate dielectric layer segments, one gate dielectric layer segment per finger 454. Each gate dielectric layer segment may be characterized for example, similarly to the gate dielectric layer 116 as described in reference to FIG. 1A and FIG. 1B. The STI oxide layer, the LOCOS oxide layer, the body region, and the gate dielectric layer are not shown in FIG. 4A to more clearly show the configurations of the gate 420, the body connection 410, the source 412, the lightly-doped drain layer 422 and the gate contact regions 424a, 424b, 424c, and 424d.

FIG. 4B is a cross section through drain contact region 424b. The drain contact region 424b is located on the lightly-doped drain layer segment 422b which is over p-type semiconductor material 432. The lightly-doped drain layer segment 422b extends under adjacent instances of the LOCOS oxide layer 418. The drain contact region 424b is located between, and laterally separated from, the adjacent instances of the LOCOS oxide layer 418. A silicide block layer 428 is located over a boundary between the lightly-doped drain layer segment 422b and the adjacent instances of the LOCOS oxide layer 418, extending partway over the drain contact region 424b, and partway over the adjacent instances of the LOCOS oxide layer 418. The gate segments 420a and 420b are located on the adjacent instances of the LOCOS oxide layer 418, on opposite sides of the drain contact region 424b.

Metal silicide 426 is located on the drain contact region 424b where exposed by the silicide block layer 428. A contact 448 extends through a PMD layer 446 to make an electrical connection to the drain contact region 424b through the metal silicide 426. The drain contact region 424b is free of the metal silicide 426 directly under the silicide block layer 428. Having the metal silicide 426 recessed from the boundaries of the LOCOS oxide layer 418 as shown in FIG. 4B may reduce an electric field in the lightly-doped drain layer segment 422b during operation of the semiconductor device 400, thus advantageously improving reliability of the NMOS transistor 406.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A transistor, comprising:
    first and second source regions and a drain region all having a first conductivity type, and a body region having an opposite second conductivity type located between the first and second source regions;
    a shallow trench isolation (STI) structure between the first and second source regions and the body region;
    a local oxidation of silicon (LOCOS) structure between the drain region and the source region; and
    a gate structure partially overlapping the LOCOS structure and the STI structure.

2. The transistor of claim 1, further comprising a contact over the STI structure that electrically connects to the gate structure.

3. The transistor of claim 1, wherein the STI structure forms a ring that laterally surrounds the body contact region.

4. The transistor of claim 1, wherein the LOCOS structure forms a ring that laterally surrounds the STI structure, the source region and the body region.

5. The transistor of claim 1, wherein the gate structure laterally surrounds the first and second source regions and the body region.

6. The transistor of claim 1, wherein the first conductivity type is N-type and the second conductivity type is P-type.

7. A method of forming a semiconductor device, comprising:
    forming a local oxidation of silicon (LOCOS) structure over a semiconductor substrate;
    forming a shallow trench isolation (STI) structure within an area enclosed by the LOCOS structure;
    forming first and second source regions within the enclosed region, the STI structure being between first and second source regions;
    forming a gate structure over the substrate, a first portion of the gate structure being between the first source region and the LOCOS structure, and a second portion of the gate structure being between the second source region and the LOCOS structure; and
    forming a contact over the STI structure that electrically connects to the gate structure.

8. The method of claim 7, wherein the STI structure forms a ring that laterally surrounds a body contact region.

9. The method of claim 7, wherein the LOCOS structure forms a ring that laterally surrounds the STI structure.

10. The method of claim 7, wherein the gate structure laterally surrounds the first and second source regions.

11. The method of claim 7, further comprising forming a drain region, the LOCOS region being between the drain region and the source region and partially underlying the gate structure.

12. A semiconductor device, comprising:
    a shallow trench isolation (STI) structure formed over a semiconductor substrate, and a local oxidation of silicon (LOCOS) structure that forms a closed path that laterally surrounds the STI structure;
    a source region between the LOCOS structure and the STI structure;
    a gate structure between the source region and the LOCOS structure; and
    a contact over the STI structure that electrically connects to the gate structure.

13. The semiconductor device of claim 12, wherein the source region is a first source region and further comprising a second source region, the STI structure being between the first and second source regions.

14. The semiconductor device of claim 13, wherein the gate structure laterally surrounds the first and second source regions.

15. The semiconductor device of claim 13, wherein the LOCOS structure forms a ring that laterally surrounds the first and second source regions.

16. A semiconductor device, comprising:
   a first source region and a second source region over a semiconductor substrate;
   a shallow trench isolation (STI) structure having a segment located between the first and second source regions;
   a gate structure between the first source region and a LOCOS structure laterally spaced apart from the first source region along a surface of the substrate; and
   a contact over the STI structure that electrically connects to the gate structure.

17. The semiconductor device of claim 16, wherein the STI structure forms a ring that laterally surrounds a body contact region.

18. The semiconductor device of claim 16, wherein the LOCOS structure forms a ring that laterally surrounds the STI structure.

19. The semiconductor device of claim 16, further comprising a drain region, the LOCOS structure being between the drain region and the source region and partially underlying the gate structure.

20. A method of forming a semiconductor device, comprising:
   forming a shallow trench isolation (STI) structure over a semiconductor substrate;
   forming a local oxidation of silicon (LOCOS) structure over a semiconductor substrate laterally surrounding the STI structure;
   forming a source region between the LOCOS structure and the STI structure;
   forming a gate structure over the substrate and between the source region and the LOCOS structure; and
   forming a contact over the STI structure that electrically connects to the gate structure.

* * * * *